(12) United States Patent
Son et al.

(10) Patent No.: US 11,950,471 B2
(45) Date of Patent: *Apr. 2, 2024

(54) DISPLAY APPARATUS AND METHOD OF MANUFACTURING THE SAME

(71) Applicant: Samsung Display Co., LTD., Yongin-si (KR)

(72) Inventors: Dong Hyun Son, Seoul (KR); Sung Hoon Moon, Cheonan-si (KR); Sung Jun Kim, Hwaseong-si (KR); Kohei Ebisuno, Hwaseong-si (KR); Deok Hoi Kim, Seongnam-si (KR); Sanghoon Oh, Gangwon-do (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/093,861

(22) Filed: Jan. 6, 2023

(65) Prior Publication Data
US 2023/0147378 A1 May 11, 2023

Related U.S. Application Data

(63) Continuation of application No. 17/177,363, filed on Feb. 17, 2021, now Pat. No. 11,552,157, which is a (Continued)

(30) Foreign Application Priority Data

Oct. 1, 2018 (KR) .......................... 10-2018-0116876

(51) Int. Cl.
*H10K 59/00* (2023.01)
*H10K 50/844* (2023.01)
(Continued)

(52) U.S. Cl.
CPC ......... *H10K 59/131* (2023.02); *H10K 50/844* (2023.02); *H10K 59/124* (2023.02);
(Continued)

(58) Field of Classification Search
CPC ........................... H10K 59/124; H10K 59/131
See application file for complete search history.

(56) References Cited

U.S. PATENT DOCUMENTS 9,437,665 B2 9/2016 Yoon
9,812,217 B2 11/2017 Yamazaki et al.
(Continued)

FOREIGN PATENT DOCUMENTS

KR 10-2011-0065717 6/2011
KR 10-2014-0063305 5/2014
(Continued)

OTHER PUBLICATIONS

Korean Notice of Allowance, with English Translation, of Korean Application No. 10-2018-0116876, dated Nov. 9, 2023.

*Primary Examiner* — Reema Patel
(74) *Attorney, Agent, or Firm* — KILE PARK REED & HOUTTEMAN PLLC

(57) ABSTRACT

A display apparatus includes a base substrate including a display area in which an image is displayed and a peripheral area adjacent to the display area, a source/drain pattern on the base substrate, the source/drain pattern including a connecting electrode in a pad portion of the peripheral area and a electrode of a thin film transistor in the display area, a planarization insulation layer on the base substrate, the planarization insulation layer contacting a side surface of the connecting electrode and a side surface of the electrode of the thin film transistor, and exposing a top surface of the connecting electrode, a connecting member contacting the connecting electrode, and a driving member including a (Continued)

driving circuit, the driving member being connected to the connecting member.

22 Claims, 27 Drawing Sheets

Related U.S. Application Data continuation of application No. 16/580,042, filed on Sep. 24, 2019, now Pat. No. 10,950,681.

(51) Int. Cl.
| | |
|---|---|
| H10K 59/124 | (2023.01) |
| H10K 59/131 | (2023.01) |
| H10K 59/40 | (2023.01) |
| H10K 71/00 | (2023.01) |
| H10K 77/10 | (2023.01) |
| H10K 59/12 | (2023.01) |
| H10K 102/00 | (2023.01) |

(52) U.S. Cl.
CPC ............ *H10K 59/40* (2023.02); *H10K 71/00* (2023.02); *H10K 77/111* (2023.02); *H10K 59/1201* (2023.02); *H10K 2102/311* (2023.02)

(56) References Cited

U.S. PATENT DOCUMENTS

| | | | |
|---|---|---|---|
| 10,950,681 | B2 | 3/2021 | Son et al. |
| 11,552,157 | B2 * | 1/2023 | Son .................. H10K 59/124 |
| 2014/0140019 | A1 | 5/2014 | Park et al. |
| 2015/0008432 | A1 | 1/2015 | Kim et al. |
| 2016/0077390 | A1 | 3/2016 | Sato |
| 2016/0079344 | A1 | 3/2016 | Agam et al. |
| 2016/0118244 | A1 | 4/2016 | Hayashi et al. |
| 2016/0155828 | A1 | 6/2016 | Sugawara |
| 2016/0307971 | A1 | 10/2016 | Jeon |
| 2018/0006265 | A1 | 1/2018 | Oh |
| 2018/0108859 | A1 | 4/2018 | Ahn et al. |
| 2022/0271243 | A1 | 8/2022 | Lee et al. |

FOREIGN PATENT DOCUMENTS

| | | |
|---|---|---|
| KR | 10-2015-0021212 | 3/2015 |
| KR | 10-2017-0071047 | 6/2017 |
| KR | 10-2018-0003329 | 1/2018 |
| KR | 10-2018-0012942 | 2/2018 |
| KR | 10-2018-0043434 | 4/2018 |
| KR | 10-2018-0065735 | 6/2018 |

* cited by examiner

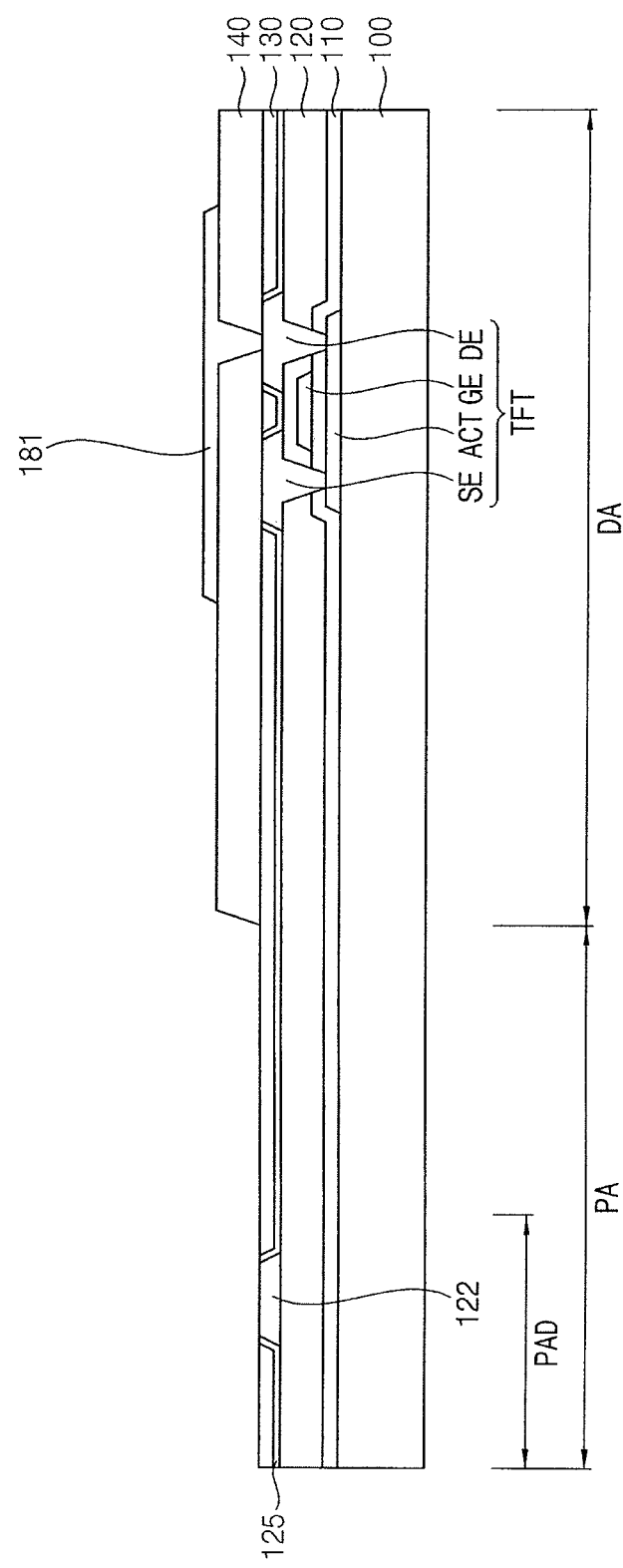

DISPLAY APPARATUS AND METHOD OF MANUFACTURING THE SAME

CROSS-REFERENCE TO RELATED APPLICATION(S)

This is a continuation application of U.S. patent application Ser. No. 17/177,363, filed Feb. 17, 2021, now U.S. Pat. No. 11,552,157, issued Jan. 10, 2023, the disclosure of which is incorporated herein by reference in its entirety. U.S. patent application Ser. No. 17/177,363 is a continuation application of U.S. patent application Ser. No. 16/580,042, filed Sep. 24, 2019, now U.S. Pat. No. 10,950,681, issued Mar. 16, 2021, the disclosure of which is incorporated herein by reference in its entirety. U.S. Pat. No. 10,950,681 claims priority benefit of Korean Patent Application 10-2018-0116876 under 35 U.S.C. § 119, filed on Oct. 1, 2018 in the Korean Intellectual Property Office, the disclosure of which is incorporated herein by reference in its entirety for all purposes.

BACKGROUND

1. Field

Exemplary embodiments relate to a display apparatus and a method of manufacturing the display apparatus.

2. Description of the Related Art

Recently, a display apparatus having light weight and small size has been manufactured. A cathode ray tube (CRT) display apparatus has been used due to a performance and a competitive price. However, the CRT display apparatus has a weakness with a size or portability. Therefore, a display apparatus such as a plasma display apparatus, a liquid crystal display apparatus, or an organic light emitting display apparatus having small size, light weight and low-power-consumption is desirable.

SUMMARY

Embodiments are directed to a display apparatus, including a base substrate including a display area in which an image is displayed and a peripheral area adjacent to the display area, a source/drain pattern on the base substrate, the source/drain pattern including a connecting electrode in a pad portion of the peripheral area and a electrode of a thin film transistor in the display area, a planarization insulation layer on the base substrate, the planarization insulation layer contacting a side surface of the connecting electrode and a side surface of the electrode of the thin film transistor, and exposing a top surface of the connecting electrode, a connecting member contacting the connecting electrode, and a driving member including a driving circuit, the driving member being connected to the connecting member.

The connecting electrode may include a first layer pattern, and a second layer pattern on the first layer pattern. A constituent material of the first layer pattern and a constituent material of the second layer pattern may be different from each other. A top surface of the second layer may contact the connecting member.

The display apparatus may further include a via insulation layer on the planarization insulation layer and a first electrode on the via insulation layer, the first electrode being electrically connected to the thin film transistor. The first electrode may include silver (Ag).

A top surface of the connecting electrode has a smaller planar area than a bottom surface of the connecting electrode, so that the connecting electrode has a constant tapered cross-section.

The display apparatus may also include a via insulation layer on the planarization layer, a light emitting structure on the via insulation layer, the light emitting structure being electrically connected to the thin film transistor, a thin film transistor on the light emitting structure, and a touch structure directly on the thin film encapsulation layer.

The display apparatus may further include a stop layer pattern between the planarization insulation layer and the base substrate and between the planarization insulation layer and a side surface of the source/drain pattern. The stop layer pattern may include different materials from the planarization insulation layer.

The stop layer pattern may include silicon oxide (SiOx) or silicon nitride (SiNx).

The stop layer pattern may include an organic insulation material.

The source/drain pattern may be received in a recess on a top surface of the planarization insulation layer. The side surface and a bottom surface of the connecting electrode may contact the planarization insulation layer.

Embodiments are also directed to a method of manufacturing a display apparatus, including forming a source/drain pattern on a base substrate that includes a display area in which an image is to be displayed and a peripheral area adjacent to the display area, the source/drain pattern including a connecting electrode in a pad portion of the peripheral area and a electrode of a thin film transistor disposed in the display area, forming a preliminary insulation layer on the base substrate on which the source/drain pattern is formed, forming a planarization insulation layer that exposes a top surface of the connecting electrode by removing a portion of the insulation layer, and connecting the connecting electrode and a driving member that includes a driving circuit, using a connecting member between the connecting electrode and the driving member.

Forming the source/drain pattern may include sequentially forming a first layer and a second layer, the second layer being made of a material different from the first layer, and forming the source/drain pattern by etching the second layer and the first layer.

The method may further include forming a via insulation layer on the planarization layer and forming a first electrode including silver (Ag) on the via insulation layer.

Forming the planarization insulation layer may include removing a portion of the preliminary insulation layer located on the connecting electrode through a chemical mechanical planarization (CMP) process to expose a top surface of the connecting electrode.

The method may further include forming a stop layer on the source/drain pattern before forming the preliminary insulation layer. Forming the planarization insulation layer may include removing a portion of the preliminary insulation layer located on the connecting electrode through a chemical mechanical planarization (CMP) process to expose the stop layer; and removing a portion of the stop layer to expose a top surface of the connecting electrode. The stop layer may include a material having a lower CMP selectivity than the planarization insulation layer for the CMP process for the planarization insulation layer.

The stop layer may include silicon oxide (SiOx) or silicon nitride (SiNx).

The stop layer may include an organic insulation material.

The method may further include forming a via insulation layer on the planarization layer, forming a light emitting structure on the via insulation layer, forming a thin film encapsulation layer on the light emitting structure and directly forming a touch structure on the thin film encapsulation layer.

The method may further include forming a lower insulation layer on the base substrate before forming the source/drain pattern. The lower insulation layer and the preliminary insulation layer formed on the base substrate on which the source/drain pattern is formed may be formed of a same material.

The method may further include forming a via insulation layer on the planarization layer, forming a light emitting structure on the via insulation layer, forming a thin film encapsulation layer on the light emitting structure, and forming a touch structure directly on the thin film encapsulation layer.

The connecting member may include a conductive adhesive.

BRIEF DESCRIPTION OF THE DRAWINGS

Features will become apparent to those of skill in the art by describing in detail exemplary embodiments with reference to the attached drawings in which:

FIGS. 9A to 9G illustrate cross-sectional views of stages a method of manufacturing the display apparatus of FIG. 4;

DETAILED DESCRIPTION

Figure 1:
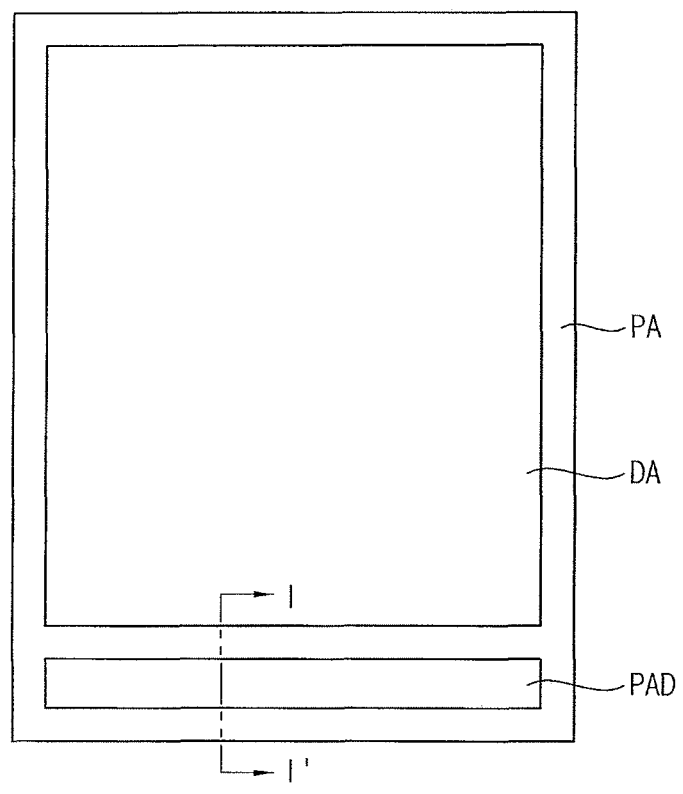
FIG. 1 illustrates a plan view of a display apparatus according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a plan view of a display apparatus according to an exemplary embodiment.

Referring to FIG. 1, the display apparatus may include a display area DA in which an image is displayed, and a peripheral area PA, which is a non-display area surrounding the display area DA. The display area DA may have a suitable shape such as polygonal, polygonal with rounded corners, elliptical, or circular, as examples. For example, as shown in FIG. 1, the display area DA may have a rectangular shape on a plane formed by a first direction D1 and a second direction D2 perpendicular to the first direction D1.

The peripheral area PA may include a left peripheral area adjacent to a left side of the display area DA, a right peripheral area adjacent to a right side of the display area DA, an upper peripheral area adjacent to an upper side of the display area DA and a lower peripheral area adjacent to a lower side of the display area DA.

A pad portion PAD may be formed in the lower peripheral area. A connecting electrode for connecting a driving member for driving the display apparatus may be disposed in the pad portion PAD. The connecting electrode may be a data pad, a gate pad, or the like to transmit a data signal, a scan signal, or the like. A portion of the peripheral area PA between the pad portion PAD and the display area DA may be formed with a bending area to allow the pad portion PAD to be located on a backside of the display area DA.

In the display area, a plurality of pixels for displaying an image, signal lines such as a scan line, a data line, and the like, may be disposed. Each of the pixels may include a light emitting structure and a pixel circuit including a thin film transistor, a storage capacitor, or the like.

Figure 2:
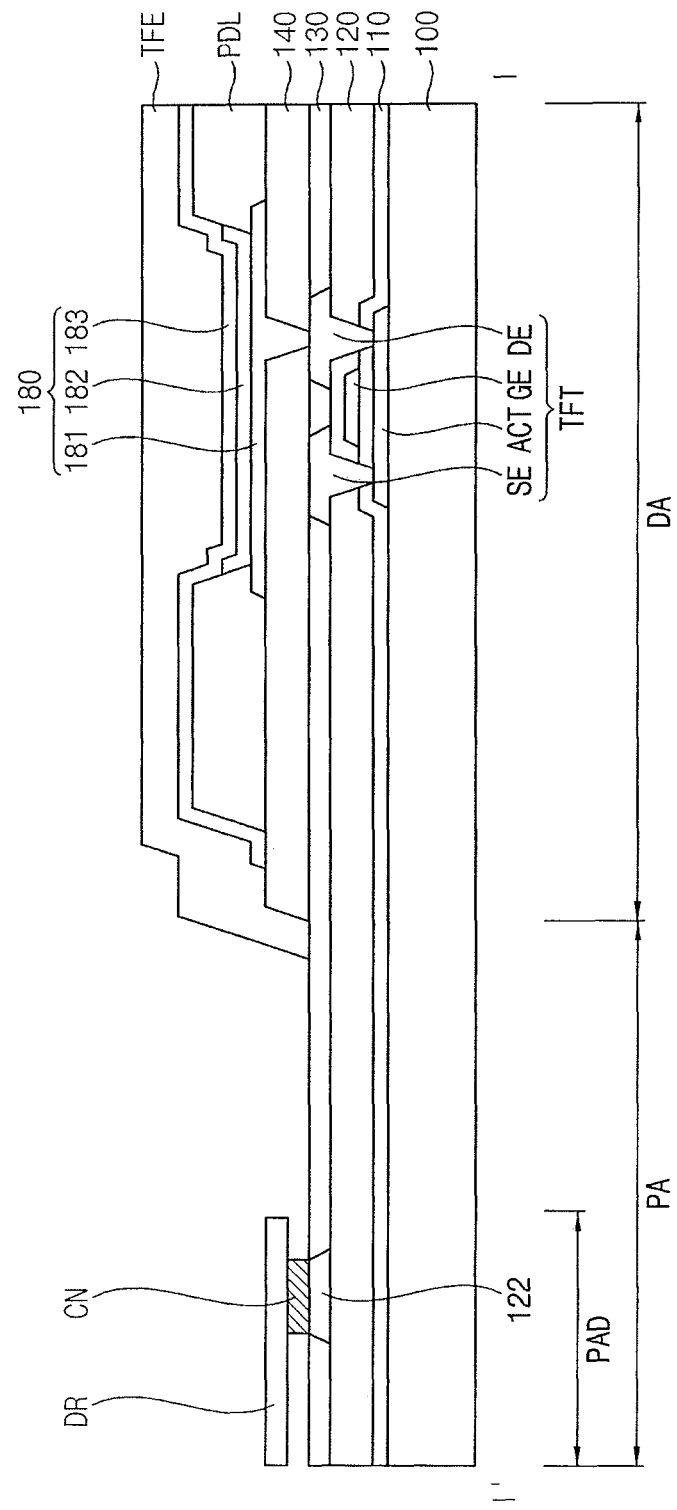
FIG. 2 illustrates a cross-sectional view taken along a line I-I' of FIG. 1.

FIG. 2 illustrates a cross-sectional view taken along a line I-I' of FIG. 1.

Referring to FIGS. 1 and 2, the display apparatus may include a base substrate 100, an active pattern ACT, a first insulation layer 110, a gate pattern, a second insulation layer 120, a source/drain pattern, a planarization insulation layer 130, a via insulation layer 140, a light emitting structure 180, a pixel defining layer PDL, a thin film encapsulation layer TFE, and a connecting member CN.

The base substrate 100 may include a transparent insulating substrate. For example, the base substrate 100 may be a transparent resin substrate having flexibility. The transparent resin substrate may include a polyimide-based resin, an acryl-based resin, a polyacrylate-based resin, a polycarbonate-based resin, a polyether-based resin, a sulfonic acid-based resin, a polyethyleneterephthalate-based resin, or the like. For example, the base substrate 100 may be a polyimide (PI) resin film.

The active pattern ACT may be disposed on the base substrate 100. The active pattern ACT may include amorphous silicon or polycrystalline silicon. In some example embodiment, the active pattern ACT may include an oxide of at least one substance selected from indium (In), gallium (Ga), tin (Sn), zirconium (Zr), vanadium (V), hafnium (Hf), cadmium (Cd), germanium (Ge), chromium (Cr), titanium (Ti), and zinc (Zn). The active pattern ACT may include a source region and a drain region doped with an impurity, and a channel region disposed between the source region and the drain region.

The display apparatus may further include a buffer layer disposed between the base substrate 100 and the active pattern ACT.

The buffer layer may help to prevent diffusion of metal atoms and/or impurities from the base substrate 100. Additionally, the buffer layer may adjust a heat transfer rate of a successive crystallization process for the active pattern ACT, thereby obtaining a substantially uniform active pattern ACT. In the case that the base substrate 100 has a relatively irregular surface, the buffer layer may improve flatness of the surface of the base substrate 100. The buffer layer may be formed using a silicon compound. For example, the buffer layer may include silicon oxide (SiOx), silicon nitride (SiNx), silicon oxynitride (SiOxNy), silicon oxycarbide (SiOxCy), silicon carbon nitride (SiCxNy), etc.

The first insulation layer 110 may be disposed on the base substrate 100 on which the active pattern ACT is disposed. The first insulation layer 110 may be uniformly formed on the base substrate 100 along a profile of the active pattern ACT. The first insulation layer 110 may include a silicon compound, metal oxide, etc.

The gate pattern may be disposed on the first insulation layer 110. The gate pattern may include a gate electrode GE, a storage electrode, and a signal line such as a gate line. The gate pattern may be formed using metal, alloy, metal nitride, conductive metal oxide, transparent conductive material, etc.

The second insulation layer 120 may be disposed on the first insulation layer 110 on which the gate pattern is disposed. For example, the second insulation layer 120 may have a relatively large thickness for sufficiently covering the gate pattern, so that the second insulation layer 120 may have a substantially level surface. In some implementations, the second insulation layer 120 may be uniformly formed on the first insulation layer 110 along a profile of the gate pattern. The second insulation layer 120 may have a substantially smaller thickness along the profile of the gate pattern, such that a stepped portion may be formed at a portion of the second insulation layer 120 adjacent to the gate pattern. The second insulation layer 120 may include a silicon compound, a metal oxide, or the like. The second insulation layer 120 may be formed of a plurality of layers.

The source/drain pattern may be disposed on the second insulation layer 120. The source/drain pattern may include a source electrode SE, a drain electrode DE and a signal line such as a data line disposed in the display area DA. The source/drain pattern may include a connecting electrode 122 disposed in the pad area PAD of the peripheral area PA.

The source/drain pattern may be formed using metal, alloy, metal nitride, conductive metal oxide, transparent conductive material, etc. The source/drain pattern may be formed of a plurality of layers. For example, the source/drain pattern may be a laminate structure including a first layer including titanium (Ti), a second layer including aluminum (Al), and a third layer including titanium (Ti).

The source electrode SE may be electrically connected to the source region of the active pattern ACT through a contact hole formed through the first insulation layer 110 and the second insulation layer 120. The drain electrode DE may be electrically connected to the drain region of the active pattern ACT through a contact hole formed through the first insulation layer 110 and the second insulation layer 120.

The active pattern ACT, the gate electrode GE, the source electrode SE, and the drain electrode DE may be included in a thin film transistor TFT as part of a pixel circuit.

The planarization insulation layer 130 may be disposed on the same layer as the source/drain pattern. For example, the planarization insulation layer 130 may be disposed on the second insulation layer 120 on which the source/drain pattern is disposed. The planarization insulation layer 130 may contact a side surface of the source/drain pattern without covering a top surface of the source/drain pattern.

The planarization insulation layer 130 may include an inorganic insulation material such as a silicon compound, a metal oxide, or an organic insulation material.

The via insulation layer 140 may be disposed on the source electrode SE, the drain electrode DE, and the planarization insulation layer 130 of the display area DA. The via insulation layer 140 may include an organic insulation material. The via insulation layer 140 may have a relatively large thickness for sufficiently covering the source/drain pattern, so that the via insulation layer 140 may be substantially level.

The via insulation layer 140 is not formed in a portion of the pad portion PAD adjacent to the connecting electrode 122. Accordingly, a top surface of the connecting electrode 122 may be exposed. The top surface of the connecting electrode 122 may contact a connecting member CN, which will be described below.

The light emitting structure 180 may be disposed in the display area DA. The light emitting structure 180 may include a first electrode 181, a light emitting layer 182 and a second electrode 183.

The first electrode 181 may be disposed on the via insulation layer 140. The first electrode 181 may be electrically connected to the thin film transistor TFT through a contact hole formed through the via insulation layer 140.

The first electrode 181 may include a reflective material or a transmissive material in accordance with the emission type of the display apparatus. For example, the first electrode 181 may be formed using aluminum, an alloy containing aluminum, aluminum nitride, silver, an alloy containing silver, tungsten, tungsten nitride, copper, an alloy containing copper, nickel, an alloy containing nickel, chromium, chromium nitride, molybdenum, an alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In example embodiments, the first electrode 181 may have a single layer structure or a multi layer structure, which may include a metal film, an alloy film, a metal nitride film, a conductive metal oxide film and/or a transparent conductive film.

In some implementations, the first electrode 181 may have a laminated structure including a first layer including indium tin oxide (ITO), a second layer including silver (Ag), and a third layer including indium tin oxide (ITO).

The pixel defining layer PDL may be disposed on the via insulation layer 140 on which the first electrode 181 is disposed. The pixel defining layer PDL may be formed using an organic material. For example, the pixel defining layer PDL may include a photoresist, an acryl-based resin, a polyimide-based resin, a polyamide-based resin, a siloxane-based resin, etc. In some example embodiments, an opening that exposes the first electrode 181 may be formed by etching the pixel defining layer PDL. An emitting area and a non-emitting area of the display apparatus may be defined by the opening of the pixel defining layer PDL. For example, a portion where the opening of the pixel defining layer PDL is located may correspond to the emitting area, and a portion adjacent to the opening of the pixel defining layer PDL may correspond to the non-emitting area.

The light emitting layer 182 may be disposed on the first electrode 181 exposed through the opening of the pixel defining layer PDL. In some implementations, the light emitting layer 182 may extend on a sidewall of the opening of the pixel defining layer PDL. In some implementations, the light emitting layer 182 may include an organic light emitting layer (EL), a hole injection layer (HIL), a hole transfer layer (HTL), an electron transfer layer (ETL), an electron injection layer (EIL), etc. In some implementation, layers of the light emitting structure 180, including the hole injection layer, the hole transport layer, the electron transport layer, and the electron injection layer, and excluding the organic emission layer, may be formed in common to correspond to a plurality of pixels. A plurality of organic light emitting layers may be formed using light emitting materials for generating different colors of light such as red light, green light and blue light in accordance with color pixels of the display device. In some example embodiments, the organic light emitting layer of the of the light emitting layer 182 may include a plurality of stacked light emitting materials for generating red light, green light and blue light to thereby emit white light. Elements of the light emitting layer 182 may be commonly formed so as to correspond to a plurality of pixels. Each pixel may be divided by a color filter layer.

The second electrode 183 may be disposed on the pixel defining layer PDL and the light emitting layer 182. The second electrode 183 may include a transmissive material or a reflective material in accordance with the emission type of the display device. For example, the second electrode 183 may be formed using aluminum, an alloy containing aluminum, aluminum nitride, silver, an alloy containing silver, tungsten, tungsten nitride, copper, an alloy containing copper, nickel, an alloy containing nickel, chromium, chromium nitride, molybdenum, an alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In example embodiments, the second electrode 183 may have a single layer structure or a multi layer structure, which may include a metal film, an alloy film, a metal nitride film, a conductive metal oxide film and/or a transparent conductive film.

The thin film encapsulation layer TFE may be disposed on the second electrode 183. The thin film encapsulation layer TFE may help to prevent penetration of moisture and oxygen from outside. The thin film encapsulation layer TFE may include at least one organic layer and at least one inorganic layer. The at least one organic layer and the at least one inorganic layer may be alternately stacked. For example, the thin film encapsulation layer TFE may include two inorganic layers and one organic layer therebetween. In some implementations, a sealing substrate may be provided instead of the thin film encapsulation layer to prevent the penetration of moisture and oxygen from outside of the display apparatus.

A driving member DR may be electrically connected the connecting electrode 122 of the pad area PAD through the connecting member CN. A top surface of the connecting electrode 122 may be exposed and not covered by an insulation layer such as the via insulation layer 140, the pixel defining layer PDL or the thin film encapsulation layer TFE. The connecting electrode 122 and the driving member DR may be electrically connected to each other by the connecting member CN.

The driving member DR may include a driving circuit or the like for generating a driving signal for driving the display apparatus. The driving member DR may include a printed circuit board, a flexible circuit board, an IC chip, or the like. The connecting member CN may include a conductive adhesive, for example, an ACF (anisotropic conductive film) or the like.

Figure 3:
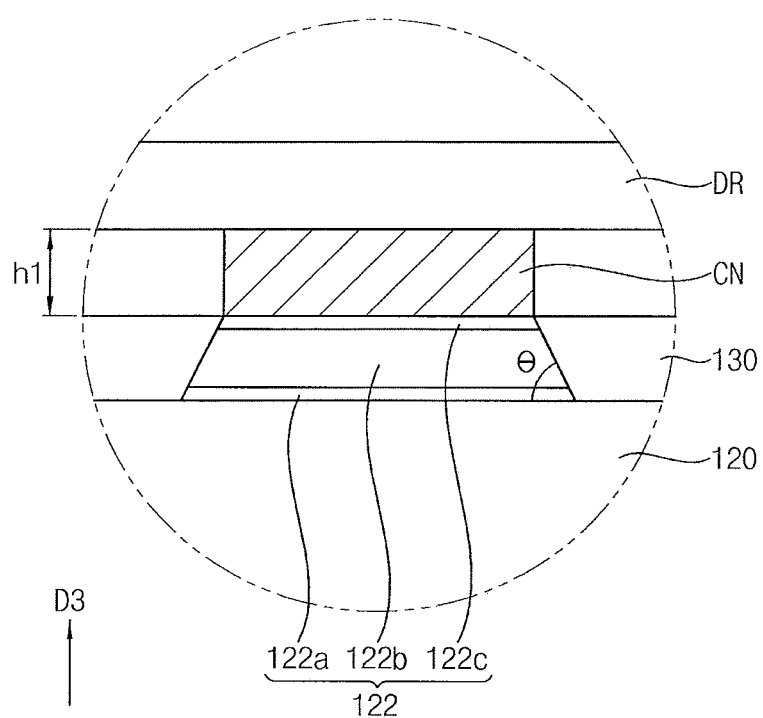
FIG. 3 illustrates a partially enlarged sectional view of the display apparatus in which a pad portion of FIG. 2 is enlarged.

FIG. 3 illustrates a partially enlarged sectional view of the display apparatus in which a pad portion illustrated in FIG. 2 is enlarged.

Referring to FIGS. 2 and 3, the connecting electrode 122 may include at least two or more layers including different materials. The connecting electrode 122 may include, for example, a first layer pattern 122a, a second layer pattern 122b, and a third layer pattern 122c.

For example, as described above regarding the source/drain pattern, the first layer pattern 122a and the third layer pattern 122c may include titanium (Ti), and the second layer pattern 122b may include aluminum (Al).

The connecting electrode 122 may have a constant tapered cross-sectional shape along a third direction D3 perpendicular to the first and second directions D1 and D2. An angle θ between a bottom surface of the connecting electrode 122 and a side surface of the connecting electrode 122 may be an acute angle less than 90 degrees.

In addition, etch selectivity of the third layer pattern 122c including the top surface of the connecting electrode 122 in contact with the connecting member CN and the second layer pattern 122b under the same etching condition may be different from each other. That is, in an etching condition of the second layer pattern 122b, etch selectivity of the third layer pattern 122c may be lower than etch selectivity of the second layer pattern 122b. In addition, etch selectivity of the third layer pattern 122c may be lower than etch selectivity of the first electrode 181 under an etch condition of the first electrode 181.

According to the present embodiment, the planarization insulation layer 130 is in contact with the side surface of the connecting electrode 122. A separate insulation layer contacting the top surface of the connecting electrode 122 is not formed. Thus, the driving member DR may be easily connected or bonded to the connecting electrode 122 using the connecting member CN irrespective of a distance hl between the driving member DR and the connecting electrode 122.

Figure 4:
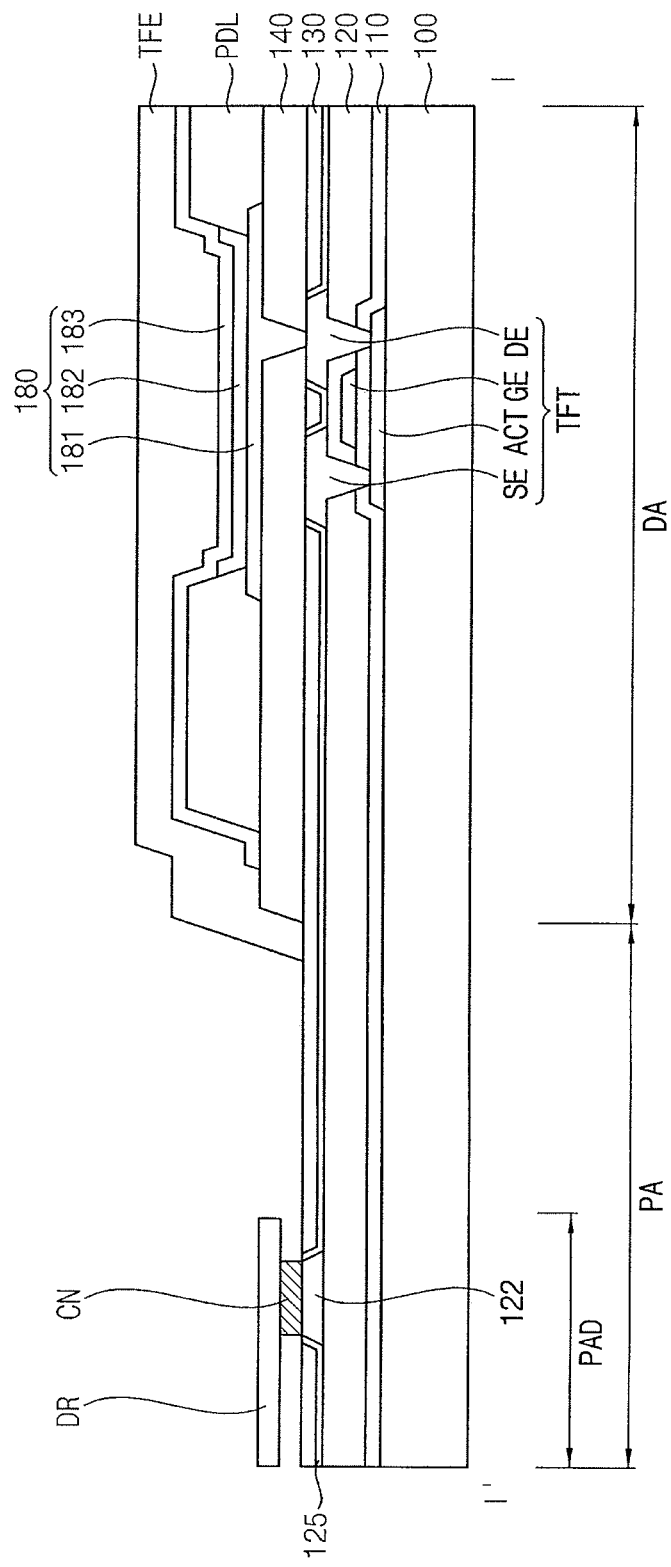
FIG. 4 illustrates a cross-sectional view of a display apparatus according to an exemplary embodiment.

FIG. 4 illustrates a cross-sectional view of a display apparatus according to an exemplary embodiment.

Referring to FIG. 4, the display apparatus may be substantially the same as the display apparatus of FIGS. 1 to 3 except for further including a stop layer pattern 125. Therefore, an explanation of features that are the same as those of FIGS. 1 to 3 will not be repeated.

The display apparatus may include a base substrate 100, an active pattern ACT, a first insulation layer 110, a gate pattern, a second insulation layer 120, the stop layer pattern 125, a source/drain pattern, a planarization insulation layer 130, a via insulation layer 140, a light emitting structure 180, a pixel defining layer PDL, a thin film encapsulation layer TFE, and a connecting member CN. The gate pattern may include a gate electrode GE. The source/drain pattern may include source and drain electrodes SE and DE disposed in a display area DA and a connecting electrode 122 disposed in a pad portion PAD of the peripheral area PA. The active pattern ACT, the gate electrode GE, the source electrode SE, and the drain electrode DE may be included in a thin film transistor TFT constituting a pixel circuit.

The stop layer pattern 125 may be disposed between the second insulation layer 120 and the planarization insulation layer 130 and between the source/drain pattern and the planarization insulation layer 130. For example, the stop layer pattern 125 may cover only a side surface of the source/drain pattern without covering a top surface of the source/drain pattern.

The stop layer pattern 125 may include different materials from the planarization insulation layer 130. For example, the stop layer pattern 125 may include a material having a lower CMP (Chemical Mechanical Polishing) selectivity than the planarization insulation layer 130 for the CMP process for the planarization insulation layer 130.

The stop layer pattern 125 may include an inorganic insulation material or an organic insulation material. For example, when the stop layer pattern 125 includes an inorganic insulation material, the stop layer pattern 125 may include silicon oxide (SiOx) or silicon nitride (SiNx). When the planarization insulation layer 130 includes silicon oxide (SiOx), the stop layer pattern 125 may include silicon nitride (SiNx).

Figure 5:
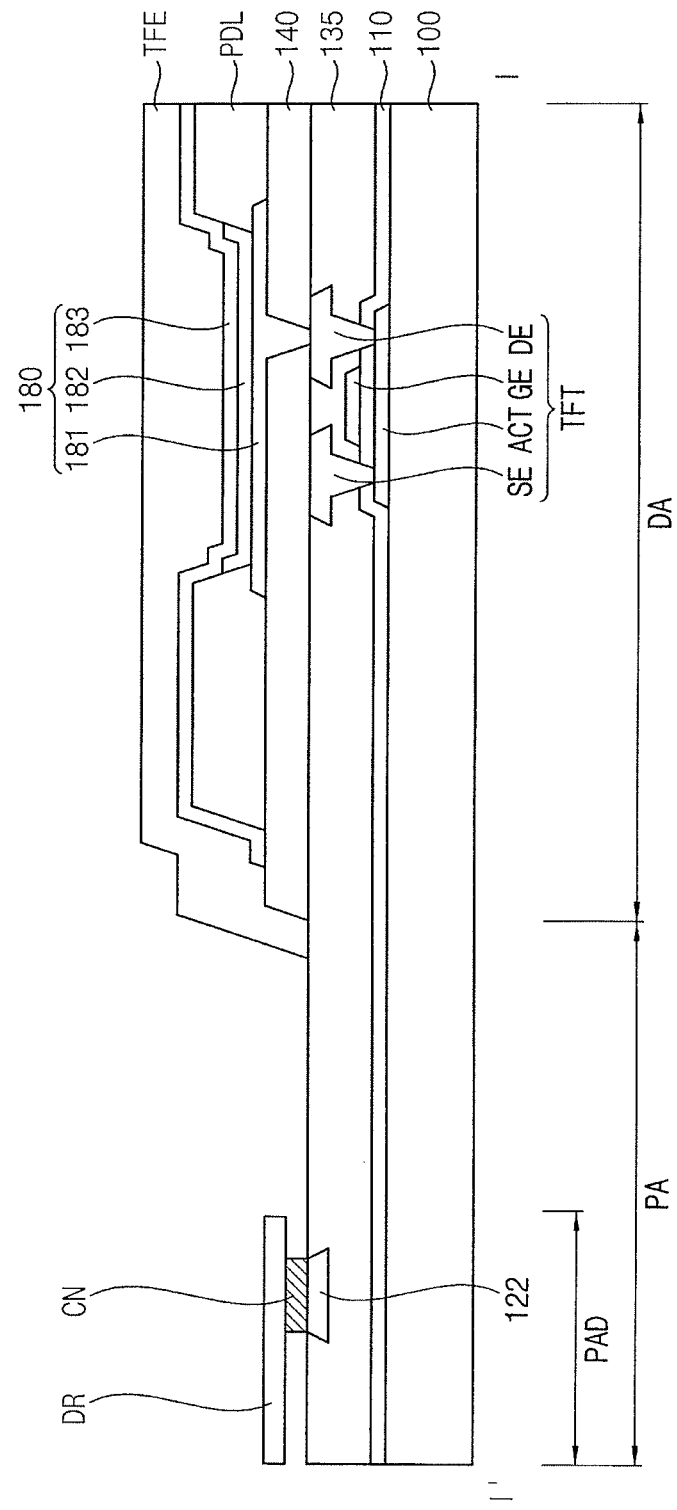
FIG. 5 illustrates a cross-sectional view of a display apparatus according to an exemplary embodiment.
Figure 6:
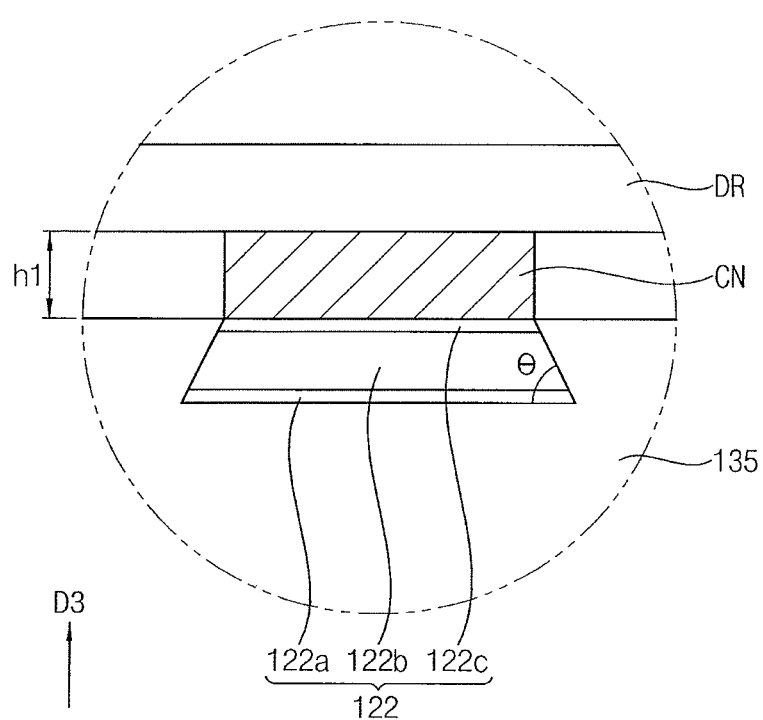
FIG. 6 illustrates a partially enlarged sectional view of the display apparatus in which a pad portion of FIG. 5 is enlarged.

FIG. 5 illustrates a cross-sectional view of a display apparatus according to an exemplary embodiment. FIG. 6 illustrates a partially enlarged sectional view of the display apparatus in which a pad portion of FIG. 5 is enlarged.

Referring to FIGS. 5 and 6, the display apparatus may be substantially the same as the display apparatus illustrated in FIGS. 1 to 3, except that a second insulation layer and a planarization insulation layer are formed as one planarization insulating layer 135. Therefore, an explanation of features that are the same as those illustrated in FIGS. 1 to 3 will not be repeated.

The display apparatus may include a base substrate 100, an active pattern ACT, a first insulation layer 110, a gate pattern, a planarization insulation layer 135, a source/drain pattern, a via insulation layer 140, a light emitting structure 180, a pixel defining layer PDL, a thin film encapsulation layer TFE, a driving member DR and a connecting member CN. The gate pattern may include a gate electrode GE. The source/drain pattern may include source and drain electrodes SE and DE disposed in a display area DA and a connecting electrode 122 disposed in a pad portion PAD of the peripheral area PA. The active pattern ACT, the gate electrode GE, the source electrode SE, and the drain electrode DE may be included in a thin film transistor TFT constituting a pixel circuit.

A recess may be formed in the planarization insulation layer 135 to receive the source/drain pattern. The recess may have a shape recessed from the top surface of the planarization insulation layer 135 in a direction opposite to the third direction D3. The source/drain pattern may be received in the recess.

The planarization insulation layer 135 may include an inorganic insulating material such as a silicon compound or a metal oxide, or an organic insulating material.

Referring to FIG. 6, the connecting electrode 122 may include a first layer pattern 122a, a second layer pattern 122b, and a third layer pattern 122c.

The connecting electrode 122 may have a constant tapered cross-sectional shape along a third direction D3 perpendicular to the first and second directions D1 and D2. An angle between a bottom surface of the connecting electrode 122 and a side surface of the connecting electrode 122 may be an acute angle θ less than 90 degrees.

Figure 7:
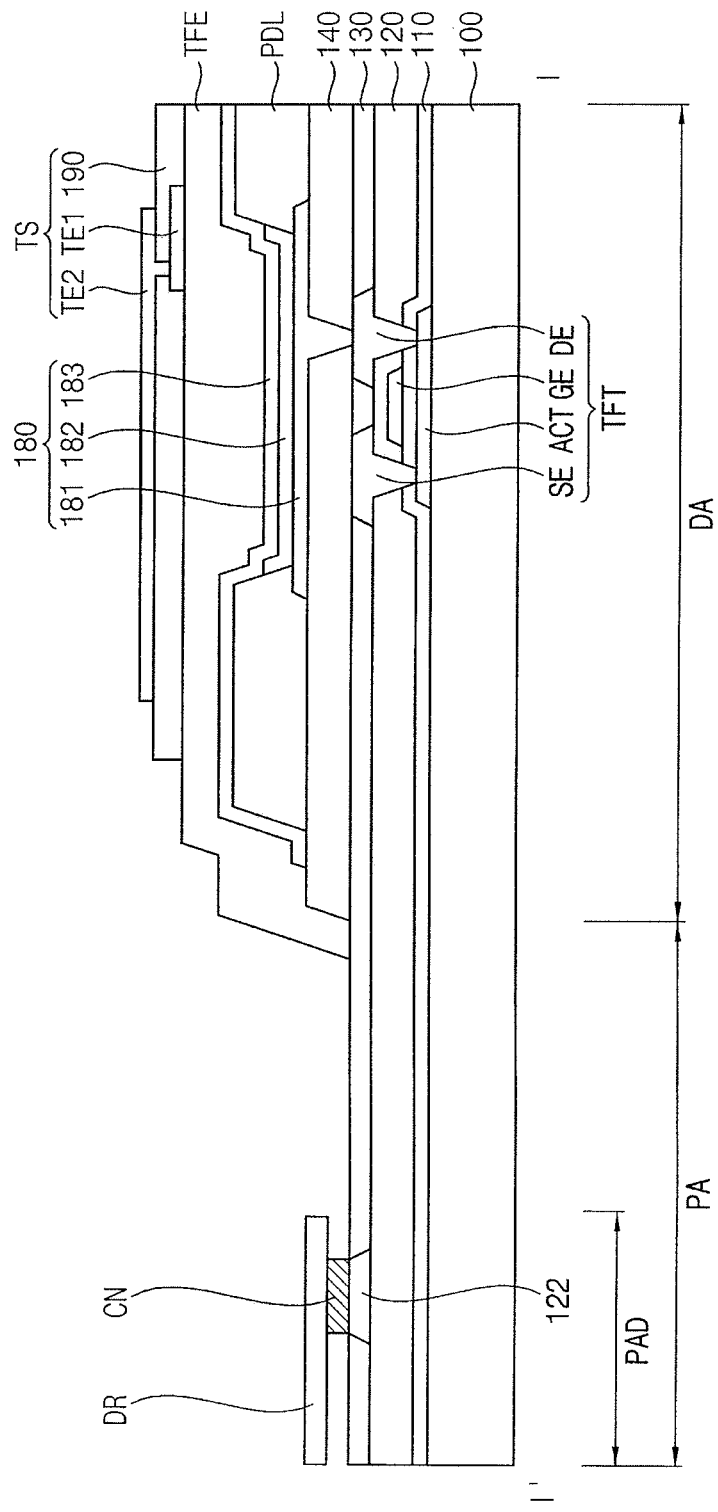
FIG. 7 illustrates a cross-sectional view of a display apparatus according to an exemplary embodiment.

FIG. 7 illustrates a cross-sectional view of a display apparatus according to an exemplary embodiment.

Referring to FIG. 7, the display apparatus is substantially the same as the display apparatus of FIGS. 1 to 3 except that it further includes a touch structure TS disposed on a thin film sealing layer TFE. Therefore, an explanation of features that are the same as those illustrated in FIGS. 1 to 3 will not be repeated.

The display apparatus may include a base substrate 100, an active pattern ACT, a first insulation layer 110, a gate pattern, a second insulation layer 120, a source/drain pattern, a planarization insulation layer 130, a via insulation layer 140, a light emitting structure 180, a pixel defining layer PDL, a thin film encapsulation layer TFE, a touch structure TS, a driving member DR and a connecting member CN. The gate pattern may include a gate electrode GE. The source/drain pattern may include source and drain electrodes SE and DE disposed in a display area DA and a connecting electrode 122 disposed in a pad portion PAD of the peripheral area PA. The active pattern ACT, the gate electrode GE, the source electrode SE, and the drain electrode DE may be included in a thin film transistor TFT constituting a pixel circuit.

The touch structure TS may be formed directly on the thin film encapsulation layer TFE. The touch structure TS may include a first touch pattern TE1, an insulation layer 190, and a second touch pattern TE2. The touch structure TS may be a suitable touch structure for touch recognition of a user. The touch structure TS may be formed directly on the thin film sealing layer TFE. In some implementations, the first and second touch patterns TE1 and TE2 may be formed as two layers with the insulation layer 190 interposed therebetween. In some implementations, the touch structure TS may be constituted by a touch pattern of one layer and an insulation layer.

According to the present embodiment, impurity formation due to an oxidation/reduction reaction in a process before forming the touch structure TS may be prevented. Accordingly, it may be possible to prevent defects such as a wiring short due to the impurities in the process of forming the touch structure TS. Thus, defects of the display apparatus can be reduced, the display quality can be improved, and process yield can be improved.

FIGS. 8A to 8F illustrate cross-sectional views of stages of a method of manufacturing the display apparatus of FIG. 2.

Figure 8A:
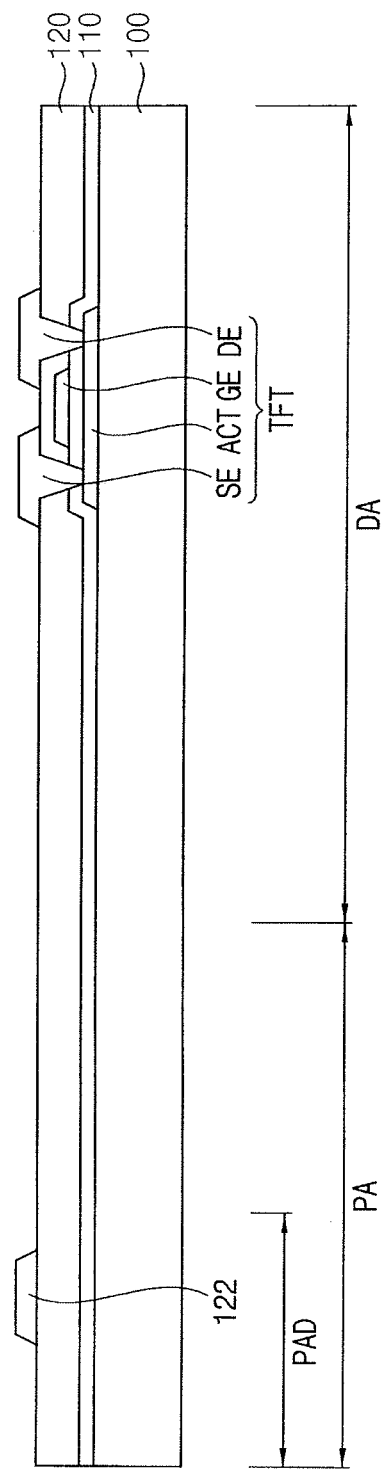
FIGS. 8A to 8F illustrate cross-sectional views of stages of a method of manufacturing the display apparatus of FIG. 2.

Referring to FIG. 8A, an active pattern ACT may be formed on a base substrate 100. A first insulation layer 110 may be formed on the base substrate 100 on which the active pattern ACT is formed. A gate pattern may be formed on the first insulation layer 110. The gate pattern may include a gate electrode GE of a thin film transistor TFT. The second insulation layer 120 may be formed on the first insulation layer 110 on which the gate pattern is formed. Thereafter, a contact hole may be formed through the second insulation layer 120 to expose a portion of the active pattern ACT.

The second insulation layer 120 may be formed by a chemical vapor deposition process, a spin coating process, a plasma enhanced chemical vapor deposition process, a sputtering process, a vacuum deposition process, a high density plasma-chemical vapor deposition process, a printing process, or the like according to its constituent material.

A source/drain pattern may be formed on the second insulation layer 120. The source/drain pattern may include a connecting electrode 122 disposed in a pad portion PAD of a peripheral area PA and source and drain electrodes SE and DE disposed in a display area DA.

The source/drain pattern may be obtained by forming a conductive layer on the second insulation layer 120 and then patterning the conductive layer using a photoetching process or an etching process using an additional etching mask. The conductive layer may be formed using a printing process, a sputtering process, a chemical vapor deposition process, a pulsed laser deposition (PLD) process, a vacuum deposition process, an atomic layer deposition (ALD) process, or the like.

The conductive layer may be formed of a plurality of layers including different constituent materials. For example, the conductive layer may include a first layer including titanium (Ti), a second layer including aluminum (Al), and a third layer including titanium (Ti). The first to third layers may be collectively etched and patterned.

Figure 8B:
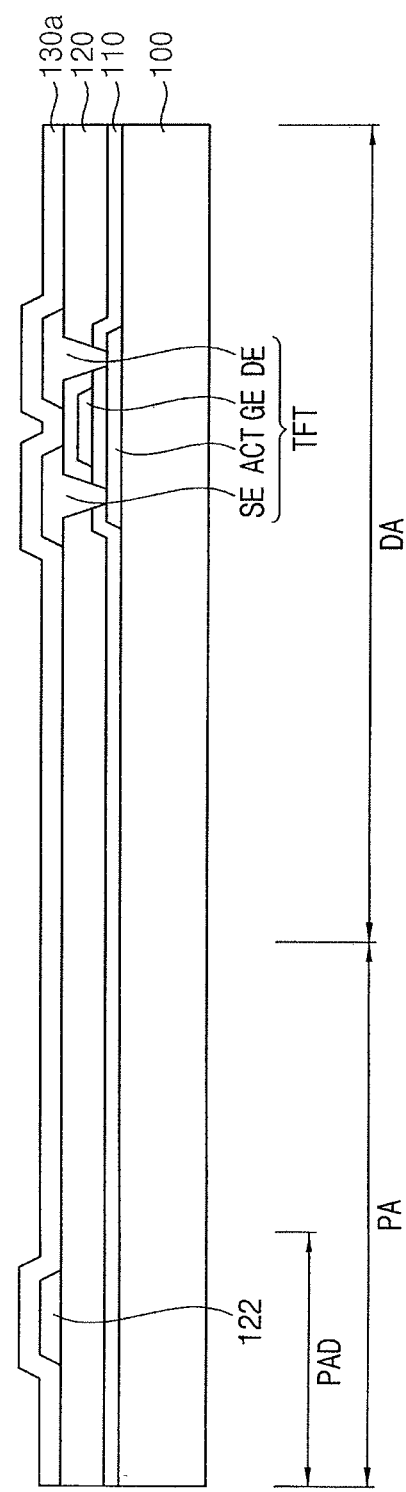

Referring to FIG. 8B, a preliminary insulation layer 130*a* may be formed on the source/drain pattern and the second insulation layer 120. The preliminary insulation layer 130*a* may be formed by a chemical vapor deposition process, a spin coating process, a plasma enhanced chemical vapor deposition process, a sputtering process, a vacuum deposition process, a high density plasma-chemical vapor deposition process, a printing process, or the like according to its constituent material.

Figure 8C:
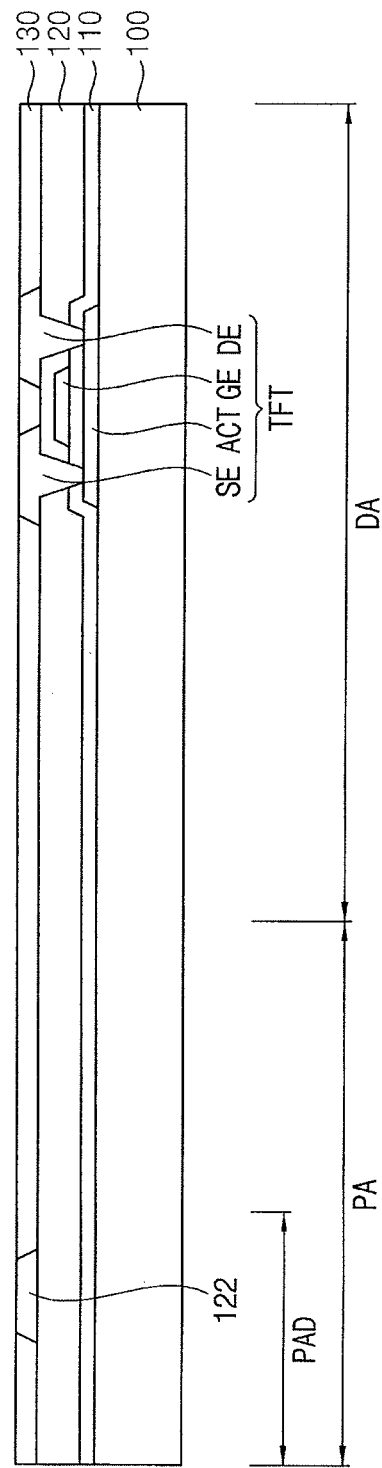

Referring to FIG. 8C, a planarization insulation layer 130 may be formed to expose a top surface of the source/drain pattern by removing a portion of the insulation layer 130*a* where a step is formed by the source/drain pattern.

For example, a portion of the preliminary insulation layer 130*a* located above the connecting electrode 122 of the pad portion PAD of the peripheral area PA may be removed through a planarization process such as a chemical mechanical planarization (CMP) process or the like, so that the top surface of the connecting electrode 122 is exposed. A portion of the preliminary insulation layer 130*a* located on the source and drain electrodes SE and DE in the display area PA may be removed to expose the source and drain electrodes SE and DE.

Figure 8D:
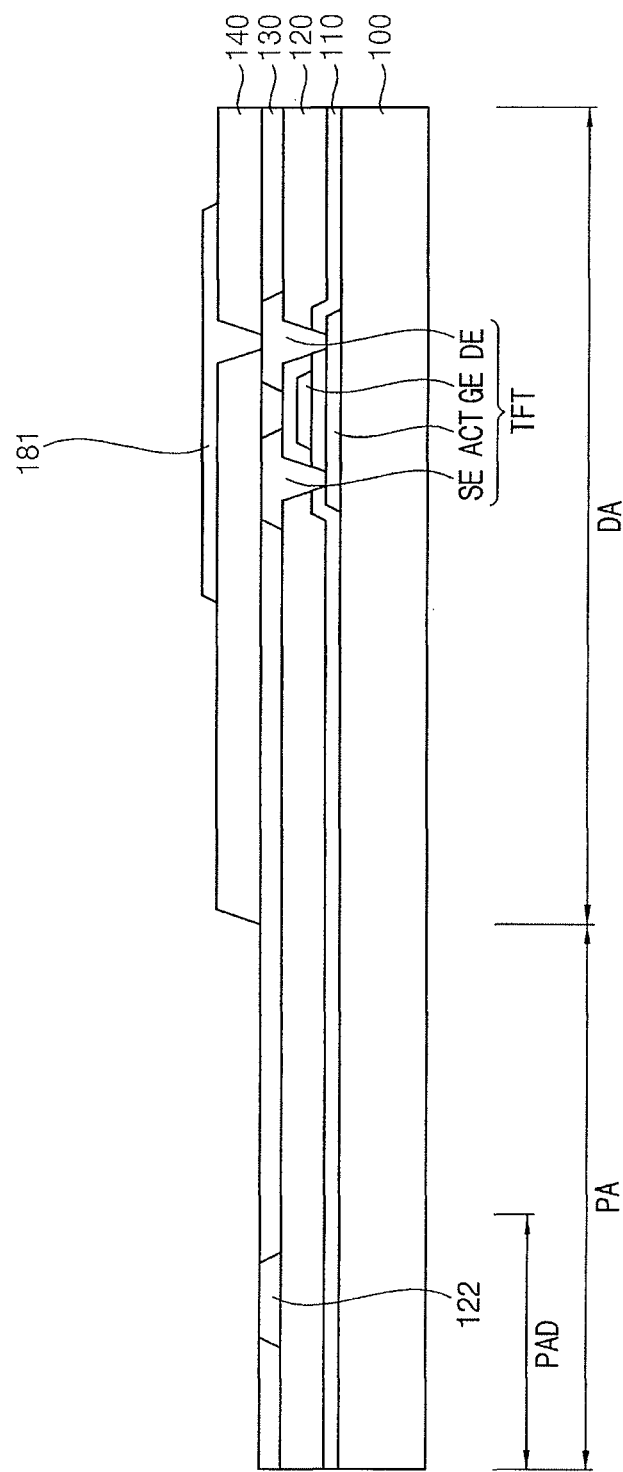

Referring to FIG. 8D, a via insulation layer 140 may be formed on the planarization insulation layer 130 and on the source and drain electrodes SE and DE. A contact hole may be formed in the via insulation layer 140 to expose a portion of the drain electrode DE. The via insulation layer 140 may be formed by forming a photoresist layer on the planarization insulation layer 130, followed by exposure and development.

A first electrode 181 may be formed on the via insulation layer 140. The first electrode 181 may be obtained by forming a conductive layer on the via insulation layer 140 and then patterning the conductive layer using a photoetching process or an etching process using an additional etching mask. The conductive layer may be formed using a printing process, a sputtering process, a chemical vapor deposition process, a pulsed laser deposition (PLD) process, a vacuum deposition process, an atomic layer deposition (ALD) process, or the like.

The conductive layer may be formed of a plurality of layers including different constituent materials. For example, the conductive layer may include a first layer including indium tin oxide (ITO), a second layer including silver (Ag), and a third layer including indium tin oxide (ITO). The first to third layers may be collectively etched and patterned.

When the first electrode 181 is formed according to a general process, there is a risk that an etching process for patterning the first electrode 181 could affect a conductive pattern other than the first electrode 181. For example, in a process of patterning the first electrode 181, an impurity due to oxidation/reduction reaction could be formed on the surface of the connecting electrode 122. When the first electrode 181 includes silver (Ag), silver particles could be deposited on the surface of the connecting electrode 122. Further, it has been found through experiments that impurities could also be precipitated on the conductive pattern at a portion where an edge portion of the via insulation layer 140 is in contact with the conductive pattern.

The impurities such as silver particles could affect the patterning process of a subsequent conductive pattern, for example, a patterning process of the second electrode or the like, which could cause defects in the display apparatus, thereby deteriorating display quality and process yield. To address this issue, when the first electrode 181 is patterned according to the present embodiment, only the top surface (refer to 122*c* in FIG. 3) of the third layer of the connecting electrode 122 is exposed. The third layer pattern 122*c* may be formed of titanium, which is less affected by the patterning of the first electrode 181. The side surface of the connecting electrode, including the second layer pattern formed of aluminum (see 122*b* in FIG. 3)), which could be greatly affected by the patterning of the first electrode 181, is covered by the planarization insulation layer 130 and not exposed. Thus, precipitation of impurities on the surface of the connecting electrode 122 can be minimized.

Accordingly, the impurities affecting the subsequent process may be minimized, the defects of the display apparatus may be reduced, the display quality may be improved, and the process yield may be improved.

Figure 8E:
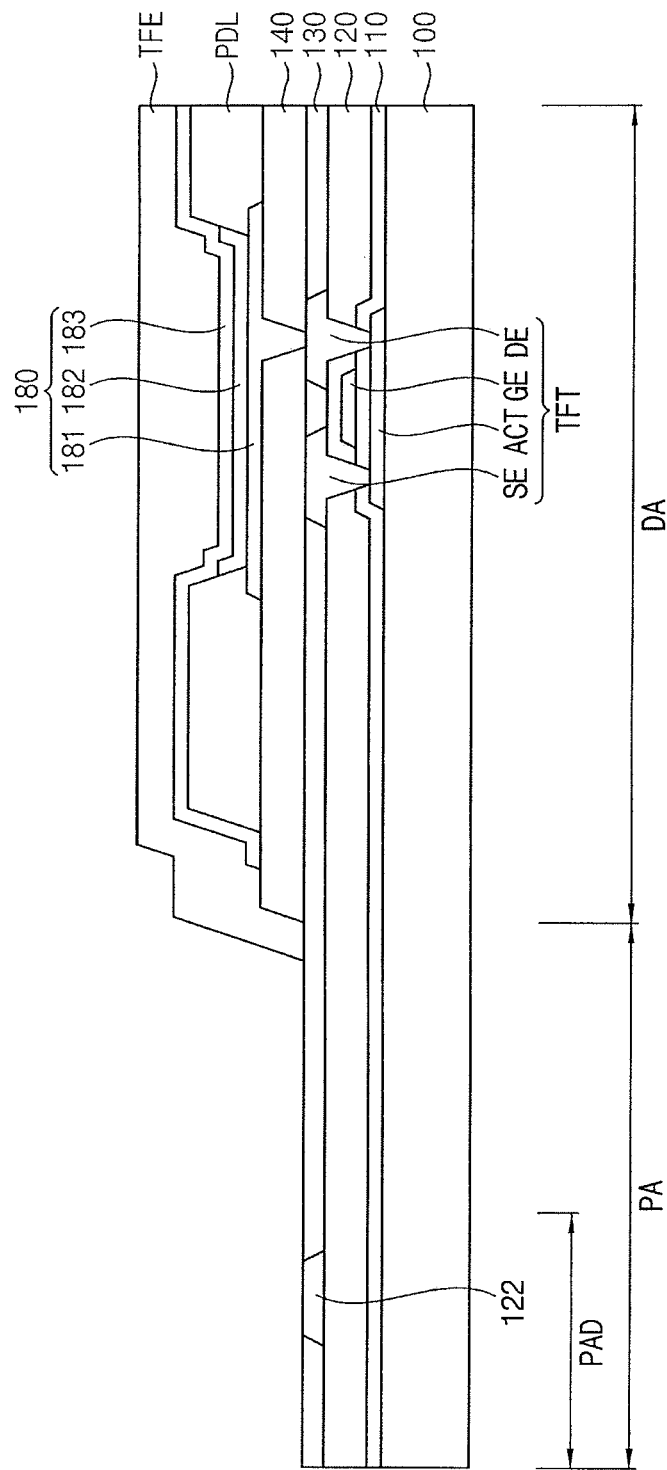

Referring to FIG. 8E, a pixel defining layer PDL defining an opening may be formed on the via insulation layer 140 on which the first electrode 181 is formed. A light emitting layer 182 may be formed on the first electrode 181 in the opening of the pixel defining layer PDL.

A second electrode 183 may be formed on the light emitting layer 182. The second electrode 182 may be formed by forming a conductive layer on the light emitting layer 183 and the pixel defining layer PDL and then patterning the conductive layer using a photoetching process or an etching process using an additional etching mask. The conductive layer may be formed using a printing process, a sputtering process, a chemical vapor deposition process, a pulsed laser deposition (PLD) process, a vacuum deposition process, an atomic layer deposition (ALD) process, or the like.

A thin film encapsulation layer TFE may be formed on the second electrode 183.

Figure 8F:
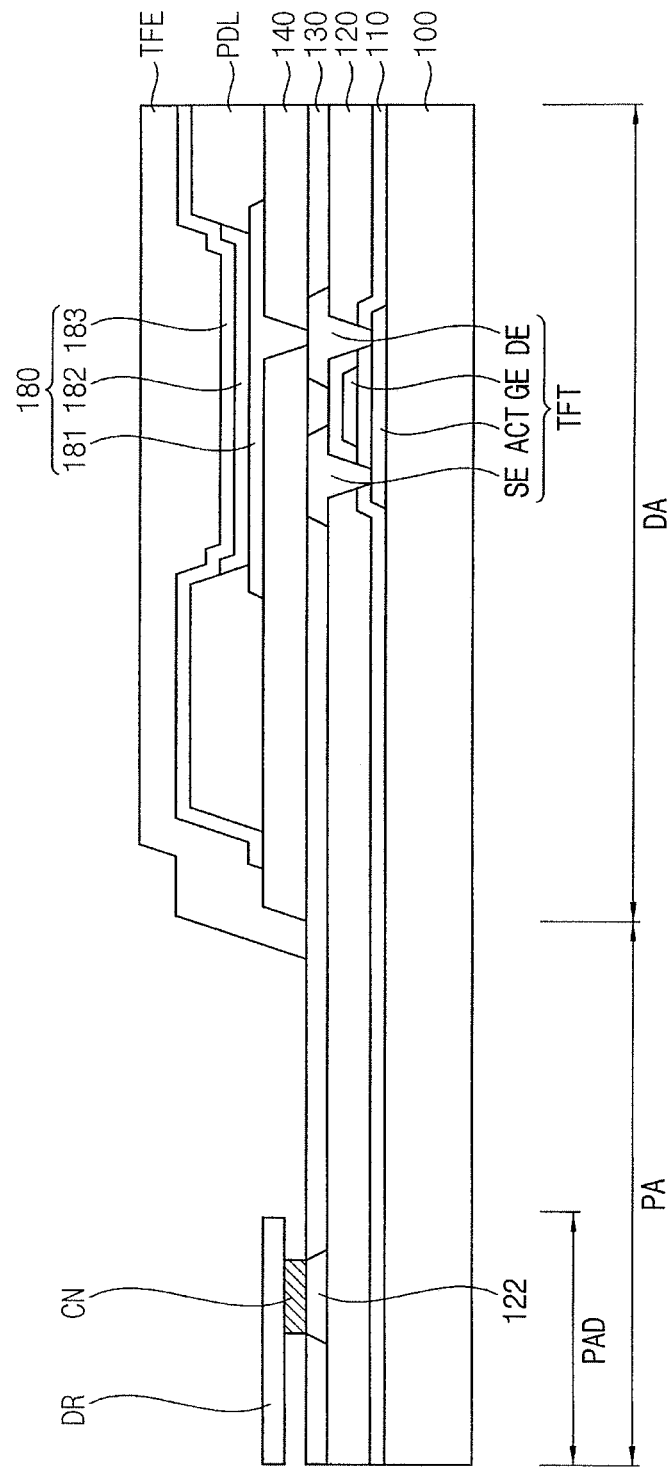

Referring to FIG. 8F, by using a connecting member CN, a driving member DR may be connected to the connecting electrode 122 of the pad portion PAD. Accordingly, the display apparatus may be manufactured. The connecting member CN may include a conductive adhesive, for example, an ACF (anisotropic conductive film) or the like.

The top surface of the connecting electrode 122 may be on a same level as a top surface of the planarization insulation layer 130 adjacent to the connecting electrode 122. Accordingly, the driving member DR may be easily connected to the display apparatus using the connecting member CN.

FIGS. 9A to 9G illustrate cross-sectional views of stages of a method of manufacturing the display apparatus illustrated in FIG. 4. The method is substantially the same as the method of FIGS. 8A to 8F, except for forming a stop layer 125*a* and a stop layer pattern 125. Therefore, an explanation of stages that are the same as those illustrated in FIGS. 8A to 8F will not be repeated.

Figure 9A:
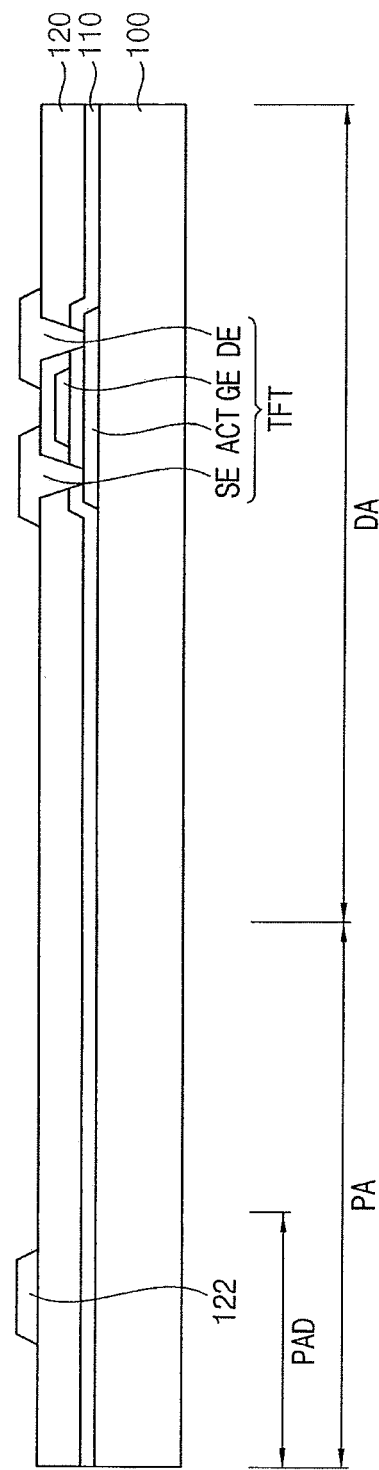

Referring to FIG. 9A, an active pattern ACT, a first insulation layer 110, a gate pattern including a gate electrode GE, and a second insulation layer 120 may be formed on a base substrate 100.

A source/drain pattern may be formed on the second insulation layer 120. The source/drain pattern may include a connecting electrode 122 in the pad portion PAD of the peripheral area PA and source and drain electrodes SE and DE in the display area DA.

Figure 9B:
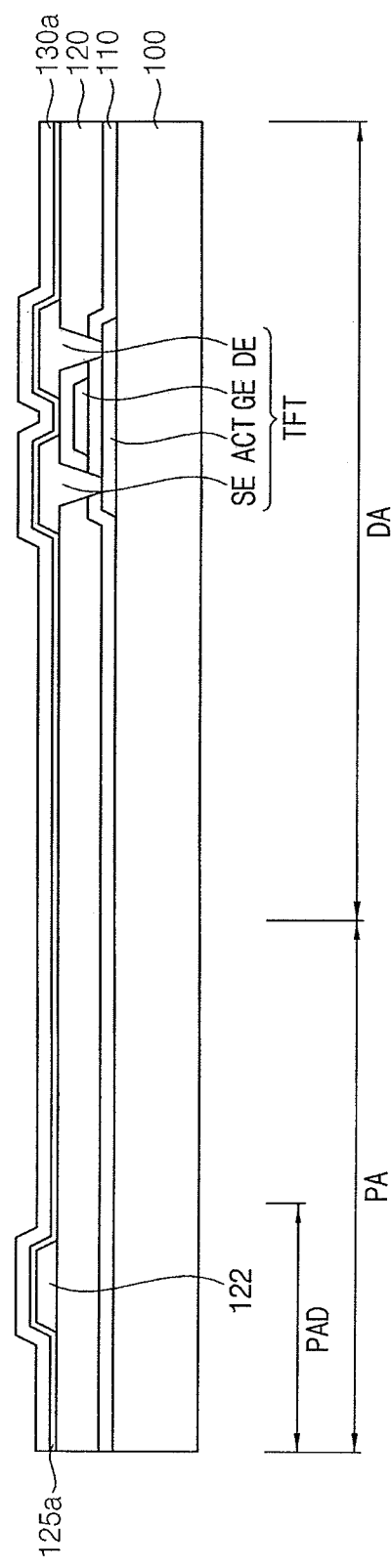

Referring to FIG. 9B, a stop layer 125a and a preliminary insulation layer 130a may be sequentially formed on the source/drain pattern and the second insulation layer 120.

The stop layer 125a and the preliminary insulation layer 130a may be formed by a chemical vapor deposition process, a spin coating process, a plasma enhanced chemical vapor deposition process, a sputtering process, a vacuum deposition process, a high density plasma-chemical vapor deposition process, a printing process, or the like according to its constituent material.

Figure 9C:
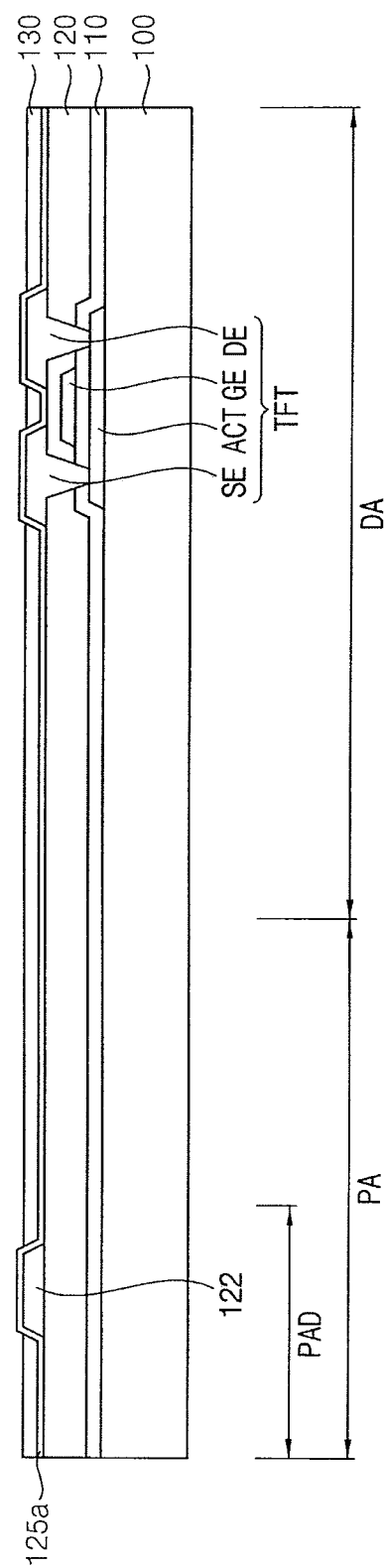

Referring to FIG. 9C, a portion of the preliminary insulation layer 130a where a step is formed by the source/drain pattern may be removed to expose a portion of the stop layer 125a on the source/drain pattern.

For example, the portion of the preliminary insulation layer 130a on the connecting electrode 122 in the pad portion PAD of the peripheral area PA may be removed through a planarization process such as a chemical mechanical planarization (CMP) process or the like. A part of the preliminary insulation layer 130a located on the source and drain electrodes SE and DE in the display area PA may also be removed.

Here, the stop layer 125a may include a material having a lower CMP selectivity than the preliminary insulation layer 130a in the CMP process for the preliminary insulation layer 130a. For example, in the CMP process for removing the portion of the preliminary insulation layer 130a, the stop layer 125a may be left without being removed. For example, when the preliminary insulation layer 130a includes silicon oxide (SiOx), the stop layer 125a may include silicon nitride (SiNx). Accordingly, the stop layer 125a on the preliminary insulation layer 130a may not be removed by the CMP process, and the CMP process for removing the preliminary insulation layer 130a may be performed until the stop layer 125a is exposed.

The stop layer 125a may include an inorganic insulating material or an organic insulating material. For example, when the stop layer 125a includes an inorganic insulating material, the stop layer 125a may include silicon oxide (SiOx) or silicon nitride (SiNx).

Figure 9D:
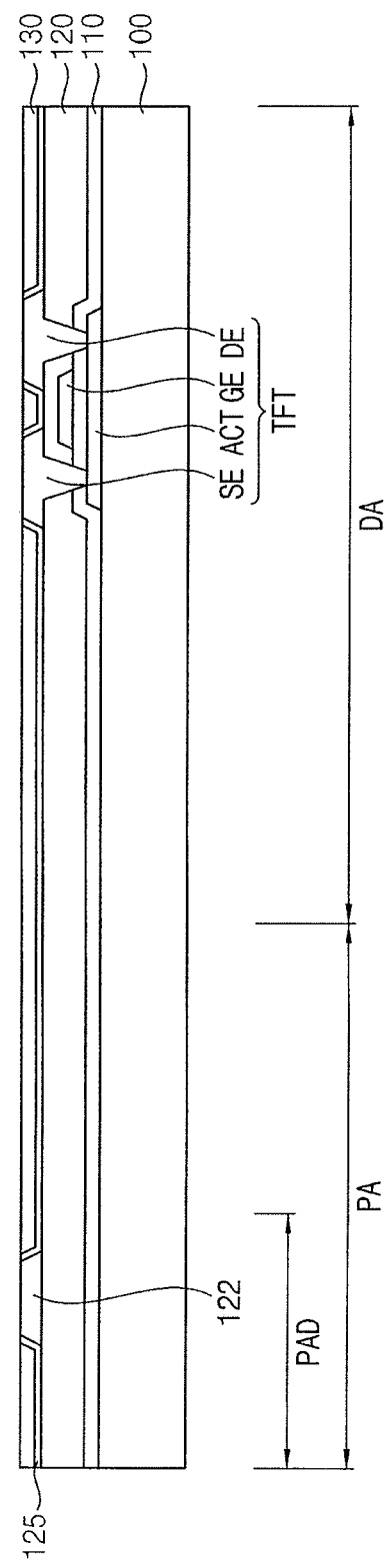

Referring to FIG. 9D, a portion of the stop layer 125a exposed by the planarization insulation layer 130 may be removed to expose the connecting electrode 122 and the source and drain electrodes SE and DE. This may be accomplished through additional processes, such as a separate polishing process, to form a stop layer pattern 125 that exposes the connecting electrode 122.

According to the present embodiment, the CMP process for forming the planarization insulation layer 130 may be performed while the top surface of the connecting electrode 122 is covered by the stop layer 125a. A portion of the stop layer 125a is removed through a separate process, so that the damage to the connecting electrode 122 by the CMP process on the preliminary insulation layer 130a can be reduced or prevented.

Referring to FIG. 9E, a via insulation layer 140 may be formed on the planarization insulation layer 130 and the source and drain electrodes SE and DE. Thereafter, a first electrode 181 may be formed on the via insulation layer 140.

Figure 9F:
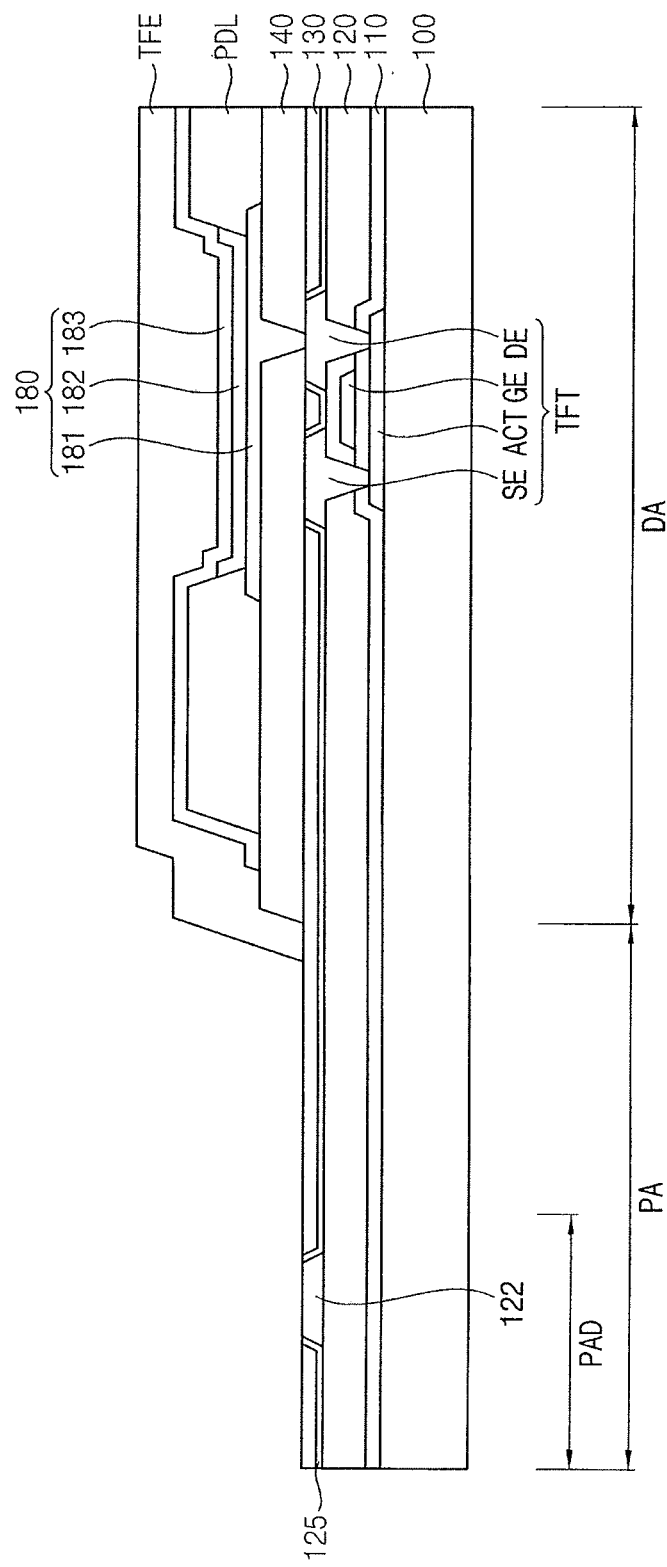

Referring to FIG. 9F, a pixel defining layer PDL defining an opening may be formed on the via insulation layer 140 on which the first electrode 181 is formed. A light emitting layer 182 may be formed on the first electrode 181 in the opening of the pixel defining layer PDL. A second electrode 183 may be formed on the light emitting layer 182. A thin film encapsulation layer TFE may be formed on the second electrode 183.

Figure 9G:
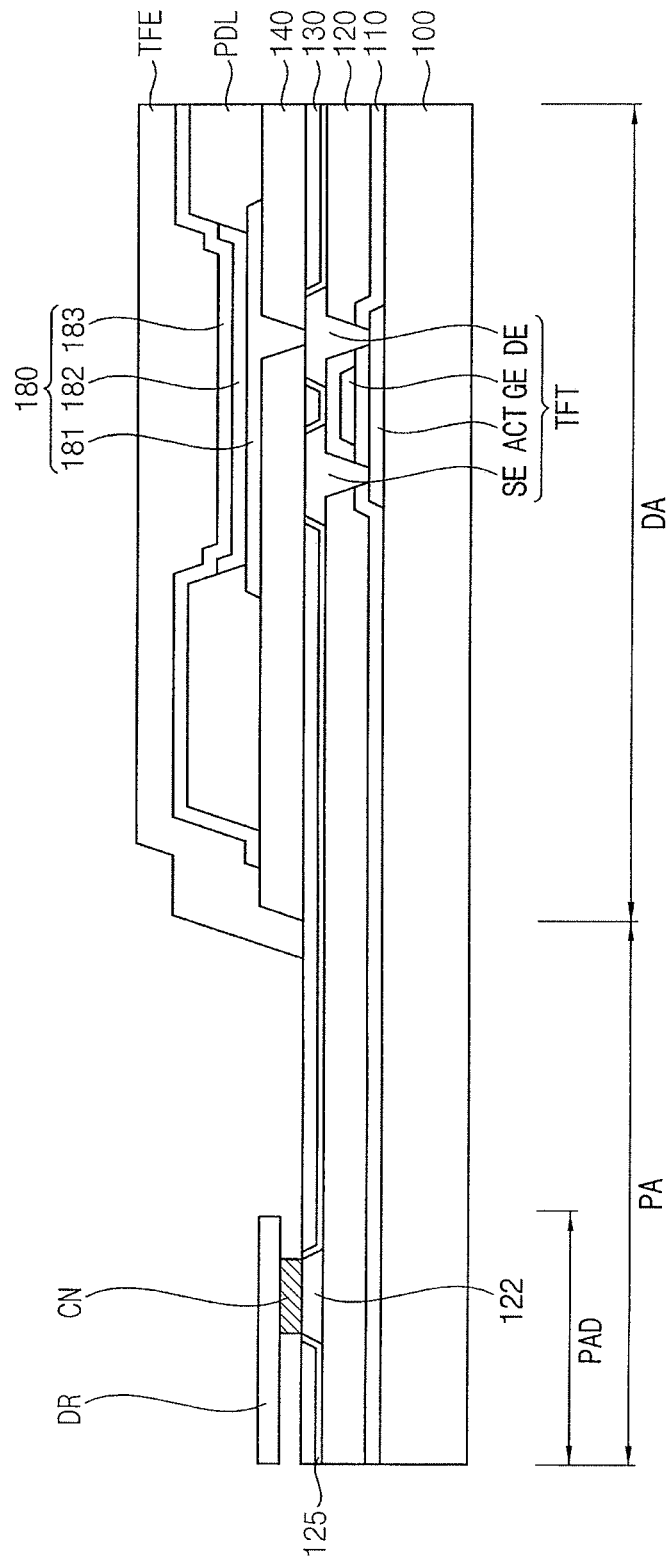

Referring to FIG. 9G, by using a connecting member CN, a driving member DR may be connected to the connecting electrode 122 of the pad portion PAD. Accordingly, the display apparatus may be manufactured.

FIGS. 10A to 10G are cross-sectional views illustrating stages of a method of manufacturing the display apparatus of FIG. 5. The method is substantially the same as the method of FIGS. 8A to 8E, except for a planarization insulation layer 135. Therefore, an explanation of stages that are the same as those described above will not be repeated.

Figure 10A:
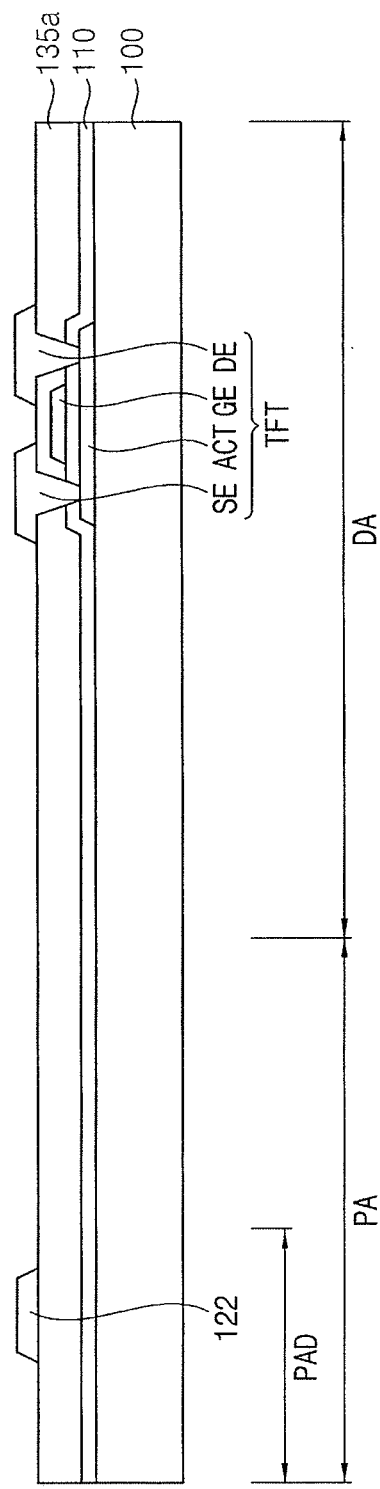
FIGS. 10A to 10C illustrate cross-sectional views of stages of a method of manufacturing the display apparatus of FIG. 5.

Referring to FIG. 10A, an active pattern ACT, a first insulation layer 110, a gate pattern including a gate electrode GE may be formed on a base substrate 100. A lower insulating layer 135a may be formed on the first insulating layer 110 on which the gate pattern is formed.

After a contact hole is formed through the lower insulating layer 135a, a source/drain pattern including source and drain electrodes SE and DE may be formed on the lower insulating layer 135a.

Figure 10B:
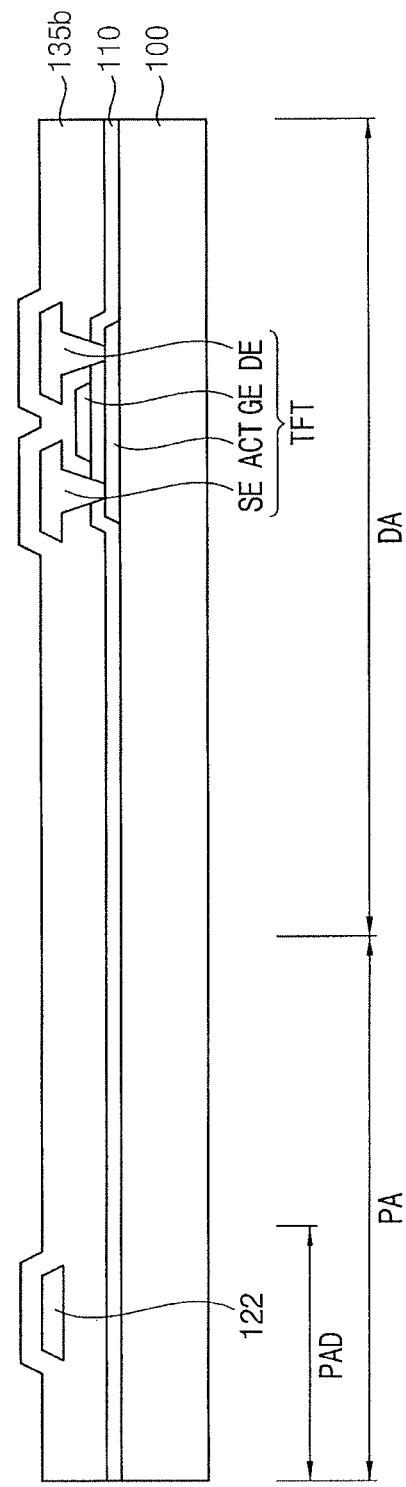

Referring to FIG. 10B, an upper insulation layer 135b may be formed on the lower insulation layer 135a on which the source/drain pattern is formed. The upper insulation layer 135b may be formed of the same material as the lower insulation layer 135a.

Figure 10C:
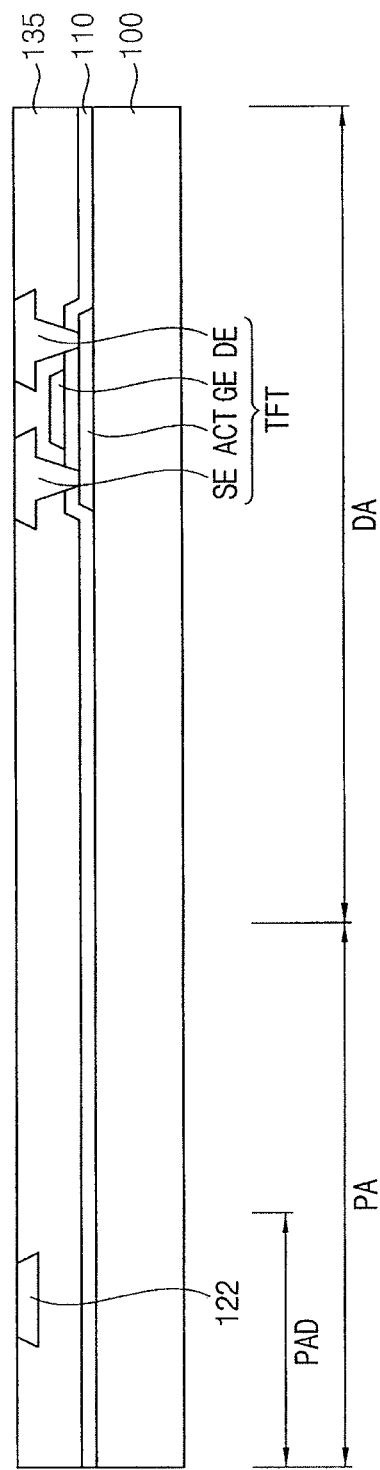

Referring to FIG. 10C, a planarization insulation layer 130 may be formed to expose a top surface of the source/drain pattern by removing a portion of the upper insulation layer 135b in which the step is formed by the source/drain pattern.

For example, the upper portion of the preliminary insulation layer 130a located above the connecting electrode 122 of the pad portion PAD of the peripheral area PA may be removed through a planarization process such as a chemical mechanical planarization (CMP) process or the like, so that the top surface of the connecting electrode 122 may be exposed. In addition, a portion of the upper insulating layer 135b located on the source and drain electrodes SE and DE in the display area PA may be removed to expose the source and drain electrodes SE and DE.

Thereafter, the display apparatus can be manufactured through the same method as the manufacturing method shown in FIGS. 8D to 8F.

Figure 11A:
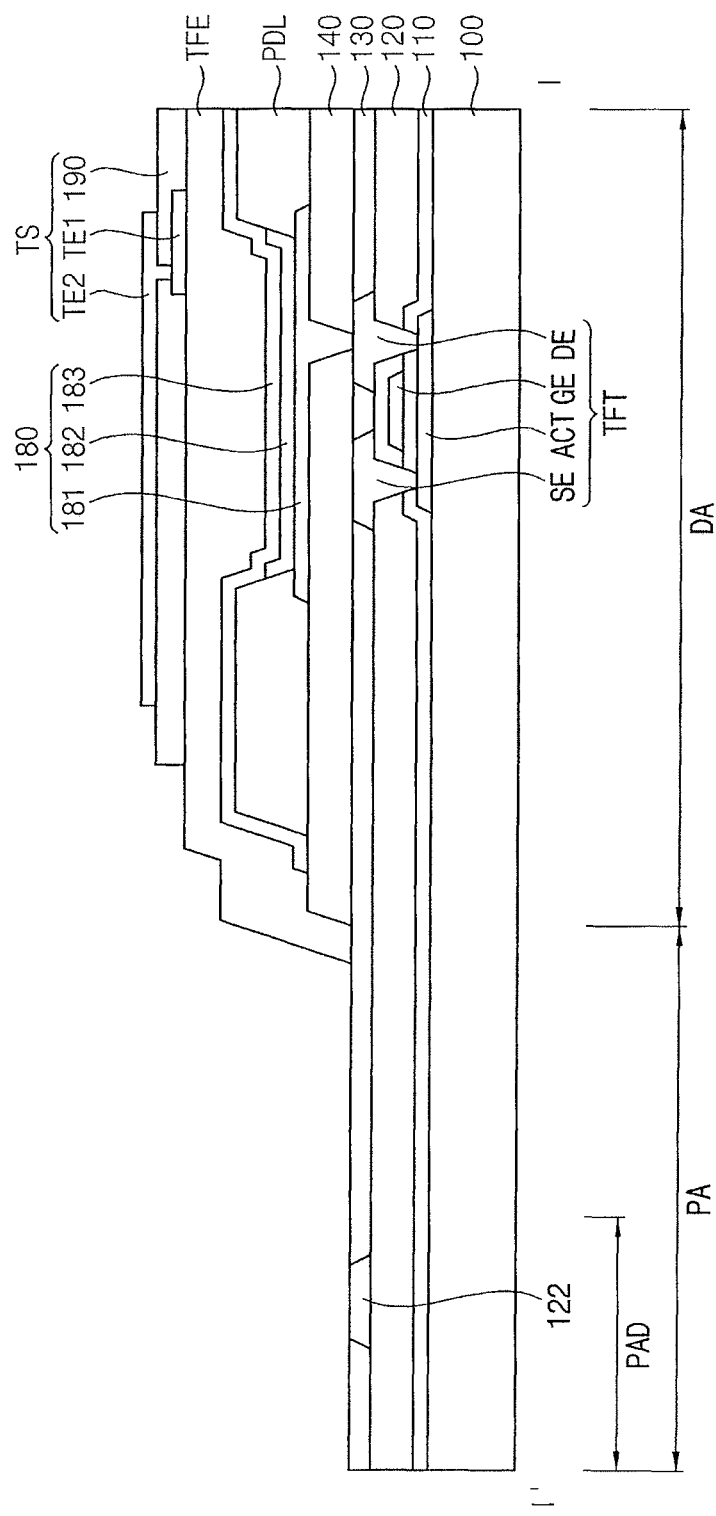
FIGS. 11A to 11B illustrate cross-sectional views of stages of a method of manufacturing the display apparatus of FIG. 7.
Figure 11B:
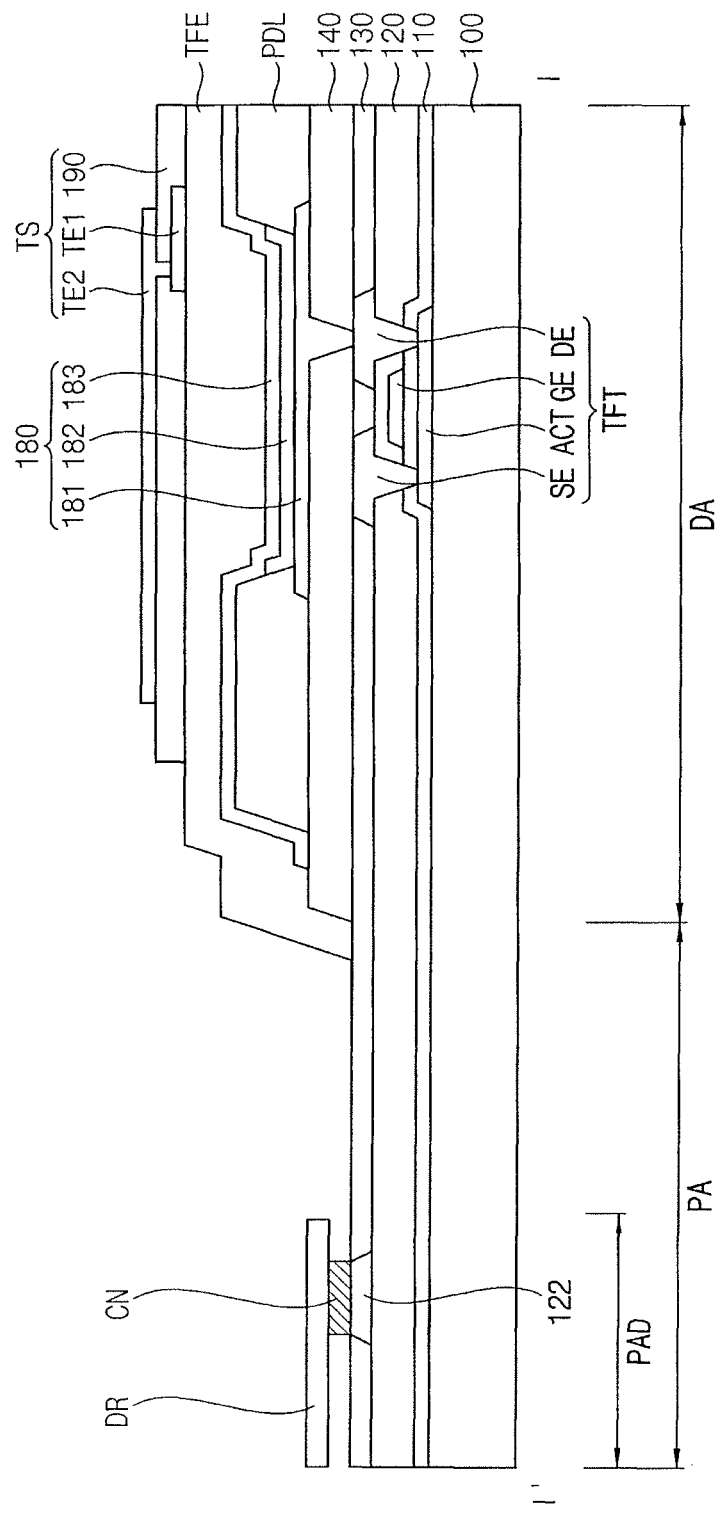

FIGS. 11A to 11B are cross-sectional views illustrating stages a method of manufacturing the display apparatus of FIG. 7. The method is substantially the same as the method of FIGS. 8A to 8F, except for further forming a touch structure TS on a thin film encapsulation layer TFE. Therefore, an explanation of stages described above will not be repeated.

Referring to FIG. 11A, an active pattern ACT, a first insulation layer 110, a gate pattern including a gate electrode GE, and a second insulation layer 120, a source/drain pattern comprising source and drain electrodes SE and DE and a connecting electrode 122, a planarization insulation layer 130, a via insulation layer 140, a light emitting structure 180, a pixel defining layer PDL, and a thin film transistor TFE may be formed on a base substrate 100.

The touch structure TS may be formed on the thin film encapsulation layer TFE. For example, the touch structure TS may be formed by forming a first touch electrode TE1, an insulating layer 190 and a second touch electrode TE2 on the thin film encapsulation layer TFE.

Impurity formation due to oxidation/reduction reaction in a forming process of the first electrode 181 may be reduced or prevented, and defects such as a wiring short due to the impurities in the process of forming the touch structure TS may be reduced or prevented as described above. Thus, defects of the display apparatus can be reduced, the display quality can be improved, and process yield can be improved.

Referring to FIG. 11B, by using a connecting member CN, a driving member DR may be connected to the connecting electrode 122 of the pad portion PAD. Accordingly, the display apparatus may be manufactured.

According to the exemplary embodiments, a method of manufacturing a display apparatus includes forming a source/drain pattern on a base substrate which includes a display area in which an image is displayed and a peripheral area adjacent to the display area, the source/drain pattern including a connecting electrode in a pad portion of the peripheral area and a electrode of a thin film transistor disposed in the display area, forming an insulation layer on the base substrate on which the source/drain pattern is formed, forming a planarization insulation layer which exposes a top surface of the connecting electrode by removing a portion of the insulation layer, and connecting the connecting electrode and a driving member which includes a driving circuit using a connecting member between the connecting electrode and the driving member. At this time, it is possible to minimize precipitation of impurities on a surface of the connecting electrode during the manufacturing process, thereby reducing defects due to the impurities in a subsequent process.

Figure 12:
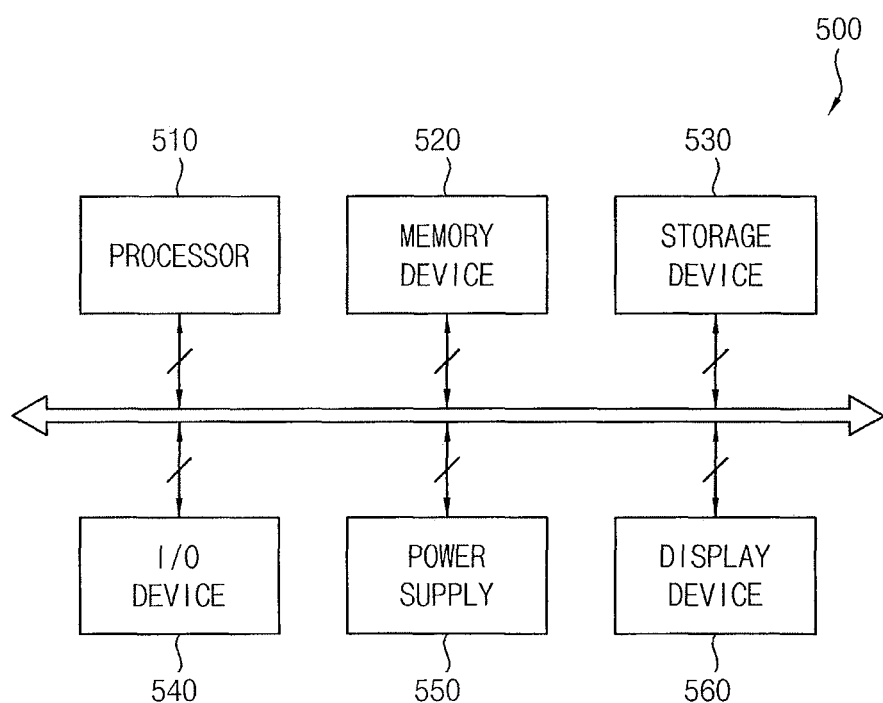
FIG. 12 illustrates a block diagram of an electronic device according to example embodiments.
Figure 13A:
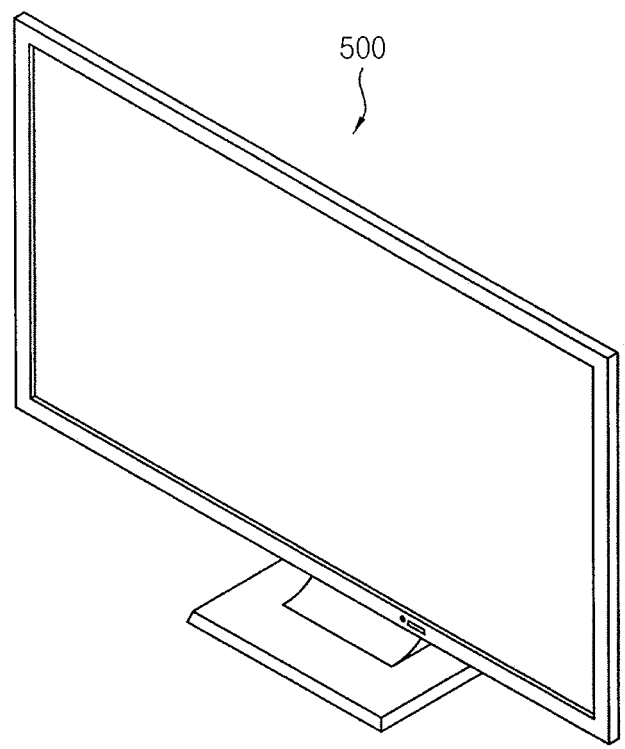
FIG. 13A illustrates an example wherein the electronic device of FIG. 12 is implemented as a television.
Figure 13B:
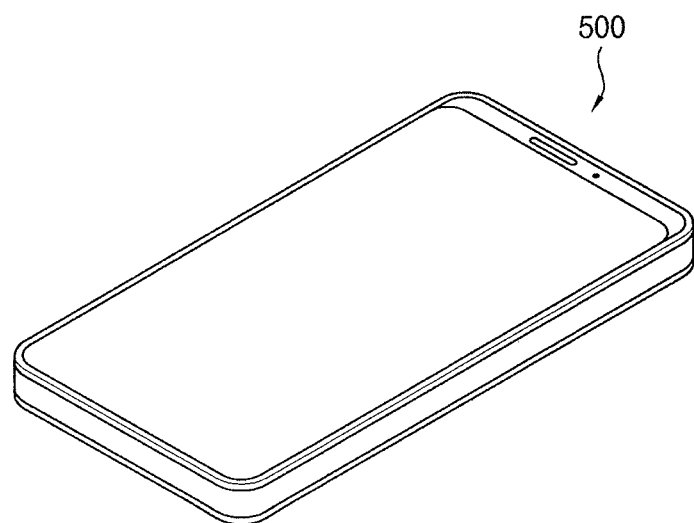
FIG. 13B illustrates an example wherein the electronic device of FIG. 12 is implemented as a smart phone.

FIG. 12 is a block diagram illustrating an electronic device according to example embodiments. FIG. 13A is a diagram illustrating an example in which the electronic device of FIG. 12 is implemented as a television. FIG. 13B is a diagram illustrating an example in which the electronic device of FIG. 12 is implemented as a smart phone.

Referring to FIGS. 12 through 13B, the electronic device 500 may include a processor 510, a memory device 520, a storage device 530, an input/output (I/O) device 540, a power supply 550, and a display device 560. The display device 560 may correspond to the display apparatus of FIG. 1. The electronic device 500 may further include a plurality of ports for communicating with a video card, a sound card, a memory card, a universal serial bus (USB) device, other electronic devices, etc. The electronic device 500 may be implemented as a cellular phone, a video phone, a smart pad, a smart watch, a tablet PC, a car navigation system, a computer monitor, a laptop, a head mounted display (HMD), etc. As mentioned above, the electronic device 500 may be implemented as a television or as a smart phone as illustrated in FIGS. 13A and 13B.

Referring again to FIG. 12, the processor 510 may perform various computing functions. The processor 510 may be a micro processor, a central processing unit (CPU), an application processor (AP), etc. The processor 510 may be coupled to other components via an address bus, a control bus, a data bus, etc. The processor 510 may be coupled to an extended bus such as a peripheral component interconnection (PCI) bus. The memory device 520 may store data for operations of the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device such as a keyboard, a keypad, a mouse device, a touchpad, a touch-screen, etc., or an output device such as a printer, a speaker, etc. The power supply 550 may provide power for operations of the electronic device 500.

The display device 560 may be coupled to other components via the buses or other communication links. In some example embodiments, the display device 560 may be included in the I/O device 540. As described above, the display device 560 may include a planarization insulation layer.

By way of summation and review, various efforts have been made to improve process yield of a manufacturing process or to improve display quality of a display apparatus by changing the manufacturing process or a layered structure of the display apparatus. Embodiments provide a display apparatus capable of improving display quality. Embodiments further provide a method of manufacturing the display apparatus capable of improving process yield. In a manufacturing process, a side surface of a connecting electrode may be covered to minimize the precipitation of impurities on a surface of the connecting electrode. Defects in the manufacturing process can be reduced, and a driving member can be easily connected to the connecting electrode using a connecting member.

Embodiments of the display apparatus and method of manufacturing the display apparatus as disclosed herein may be applied to a display device and various electronic devices including the same. For example, embodiments may be applied to a mobile phone, a smart phone, a video phone, a smart pad, a smart watch, a tablet PC, a car navigation system, a television, a computer monitor, a notebook, etc.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:
1. A display apparatus, comprising:
a base substrate including a display area in which an image is displayed, and a peripheral area adjacent to the display area;
a semiconductor layer including an active pattern disposed on the base substrate;

a first insulation layer disposed on the base substrate on which the active pattern is disposed;
a first conductive layer including a gate pattern disposed on the first insulation layer;
a second insulation layer disposed on the first insulation layer on which the gate pattern is disposed;
a second conductive layer disposed on the second insulation layer, the second conductive layer including an electrode of a thin film transistor in the display area; and
a planarization insulation layer on the second insulation layer, the planarization insulation layer contacting a side surface of the electrode of the thin film transistor, and having a top surface that is even with, and that exposes, an entire top surface of the electrode of the thin film transistor.

2. The display apparatus as claimed in claim 1, wherein the second conductive layer further includes a connecting electrode in a pad portion of the peripheral area, and the planarization insulation layer contacts a side surface of the connecting electrode and exposes an entire top surface of the connecting electrode.

3. The display apparatus as claimed in claim 2, wherein the entire top surface of the connecting electrode has a smaller planar area than a bottom surface of the connecting electrode so that the connecting electrode has a constant tapered cross-section.

4. The display apparatus as claimed in claim 2, further comprising:
a connecting member contacting the connecting electrode; and
a driving member including a driving circuit, the driving member being connected to the connecting member.

5. The display apparatus as claimed in claim 4, wherein the connecting electrode includes a first layer pattern, and a second layer pattern on the first layer pattern,
a constituent material of the first layer pattern and a constituent material of the second layer pattern are different from each other, and
a top surface of the second layer pattern contacts the connecting member.

6. The display apparatus as claimed in claim 2, wherein the connecting electrode includes a first layer pattern, and a second layer pattern on the first layer pattern, the second layer pattern including titanium (Ti), and
a constituent material of the first layer pattern is different from titanium.

7. The display apparatus as claimed in claim 2, wherein the connecting electrode includes a first layer pattern that includes aluminum (Al), and a second layer pattern on the first layer pattern, and
a constituent material of the second layer pattern is different from aluminum.

8. The display apparatus as claimed in claim 2, wherein the connecting electrode includes a first layer pattern that includes aluminum (Al), and a second layer pattern on the first layer pattern, and
the second layer pattern includes titanium (Ti).

9. The display apparatus as claimed in claim 1, further comprising:
a via insulation layer on the planarization insulation layer; and
a first electrode on the via insulation layer, the first electrode being electrically connected to the thin film transistor,
wherein the first electrode includes silver (Ag).

10. The display apparatus as claimed in claim 1, further comprising:
a via insulation layer on the planarization insulation layer;
a light emitting structure on the via insulation layer, the light emitting structure being electrically connected to the thin film transistor;
a thin film encapsulation layer on the light emitting structure; and
a touch structure directly on the thin film encapsulation layer.

11. A display apparatus, comprising:
a base substrate including a display area in which an image is displayed, and a peripheral area adjacent to the display area;
a semiconductor layer including an active pattern disposed on the base substrate;
a first insulation layer disposed on the base substrate on which the active pattern is disposed;
a first conductive layer including a gate pattern disposed on the first insulation layer;
a second insulation layer disposed on the first insulation layer on which the gate pattern is disposed;
a second conductive layer disposed on the second insulation layer, the second conductive layer including an electrode of a thin film transistor in the display area;
a third insulation layer pattern disposed on the second insulation layer, the third insulation layer pattern covering a side surface of the electrode of the thin film transistor without covering an entire top surface of the electrode of the thin film transistor; and
a planarization insulation layer on the second insulation layer on which the third insulation layer pattern is disposed, the planarization insulation layer having a top surface that is even with, and that exposes, the entire top surface of the electrode of the thin film transistor.

12. The display apparatus as claimed in claim 11, wherein the second conductive layer further includes a connecting electrode in a pad portion of the peripheral area,
the third insulation layer pattern covers a side surface of the connecting electrode without covering an entire top surface of the connecting electrode, and
the planarization insulation layer has the top surface that is even with, and that exposes, the entire top surface of the connecting electrode.

13. The display apparatus as claimed in claim 12, wherein the entire top surface of the connecting electrode has a smaller planar area than a bottom surface of the connecting electrode so that the connecting electrode has a constant tapered cross-section.

14. The display apparatus as claimed in claim 12, further comprising:
a connecting member contacting the connecting electrode; and
a driving member including a driving circuit, the driving member being connected to the connecting member.

15. The display apparatus as claimed in claim 14, wherein the connecting electrode includes a first layer pattern, and a second layer pattern on the first layer pattern,
a constituent material of the first layer pattern and a constituent material of the second layer pattern are different from each other, and
a top surface of the second layer pattern contacts the connecting member.

16. The display apparatus as claimed in claim 12, wherein the connecting electrode includes a first layer pattern, and a second layer pattern on the first layer pattern, the second layer pattern including titanium (Ti), and a constituent material of the first layer pattern is different from titanium.

17. The display apparatus as claimed in claim 12, wherein the connecting electrode includes a first layer pattern that includes aluminum (Al), and a second layer pattern on the first layer pattern, and a constituent material of the second layer pattern is different from aluminum.

18. The display apparatus as claimed in claim 12, wherein the connecting electrode includes a first layer pattern that includes aluminum (Al), and a second layer pattern on the first layer pattern, and the second layer pattern includes titanium (Ti).

19. The display apparatus as claimed in claim 11, further comprising:
   a via insulation layer on the planarization insulation layer; and
   a first electrode on the via insulation layer, the first electrode being electrically connected to the thin film transistor, wherein the first electrode includes silver (Ag).

20. The display apparatus as claimed in claim 11, further comprising:
   a via insulation layer on the planarization insulation layer;
   a light emitting structure on the via insulation layer, the light emitting structure being electrically connected to the thin film transistor;
   a thin film encapsulation layer on the light emitting structure; and
   a touch structure directly on the thin film encapsulation layer.

21. The display apparatus as claimed in claim 11, wherein the third insulation layer pattern includes silicon oxide (SiOx) or silicon nitride (SiNx).

22. The display apparatus as claimed in claim 11, wherein the third insulation layer pattern includes an organic insulation material.

* * * * *